US007659929B2

(12) United States Patent
Sakoh

(10) Patent No.: US 7,659,929 B2
(45) Date of Patent: Feb. 9, 2010

(54) SOLID-STATE IMAGE SENSOR AND METHOD OF MANUFACTURING THEREOF

(75) Inventor: Hiroshi Sakoh, Kyotanabe (JP)

(73) Assignee: Panasonic Corporation, Osaka (JP)

( * ) Notice: Subject to any disclaimer, the term of this patent is extended or adjusted under 35 U.S.C. 154(b) by 582 days.

(21) Appl. No.: 11/206,761

(22) Filed: Aug. 19, 2005

(65) Prior Publication Data
US 2006/0044449 A1 Mar. 2, 2006

(30) Foreign Application Priority Data
Aug. 24, 2004 (JP) .............................. 2004-243712

(51) Int. Cl.
*H04N 3/14* (2006.01)
*H04N 9/083* (2006.01)
(52) U.S. Cl. ..................... 348/275; 348/276; 348/290
(58) Field of Classification Search .............. 348/272, 348/275, 274, 276, 290, 340; 257/292, 291; 250/239, 208.1, 226, 216
See application file for complete search history.

(56) References Cited
U.S. PATENT DOCUMENTS

| | | | |
|---|---|---|---|
| 5,731,110 A * | 3/1998 | Hishiro et al. ................. 430/7 |
| 5,835,274 A | 11/1998 | Baek | |
| 6,255,640 B1 | 7/2001 | Endo et al. | |
| 6,590,270 B2 * | 7/2003 | Suzuki ........................ 257/436 |
| 6,753,557 B2 * | 6/2004 | Nakai ........................... 257/233 |
| 6,818,962 B2 * | 11/2004 | Yamamoto ................... 257/432 |
| 7,102,717 B2 * | 9/2006 | Chang et al. ................ 349/138 |
| 7,202,103 B2 * | 4/2007 | Sekine et al. ................. 438/70 |
| 2003/0063204 A1 * | 4/2003 | Suda ........................... 348/272 |
| 2003/0215967 A1 | 11/2003 | Shizukuishi | |
| 2006/0119932 A1 * | 6/2006 | Park et al. ................... 359/350 |

FOREIGN PATENT DOCUMENTS

| | | |
|---|---|---|
| JP | 60-130705 | 7/1985 |
| JP | 62-264005 | 11/1987 |
| JP | 05-326902 | 12/1993 |
| JP | 06-053457 | * 2/1994 |
| JP | 10-074927 | 3/1998 |
| JP | 10-173159 | 6/1998 |
| JP | 2001-249218 | 9/2001 |
| JP | 2003-107721 | 4/2003 |
| JP | 2003-332547 | 11/2003 |

OTHER PUBLICATIONS

Miyamoto Takafumi, Color Filter, Pub. date Jan. 8, 1995, # 07-198924.*

* cited by examiner

*Primary Examiner*—Tuan Ho
*Assistant Examiner*—Euel K Cowan
(74) *Attorney, Agent, or Firm*—Wenderoth, Lind & Ponack, L.L.P.

(57) ABSTRACT

A solid-state image sensor having unit pixel cells arranged in a matrix form, each unit pixel cell having a photoelectric conversion element formed on a semiconductor substrate, a color filter formed on the photoelectric conversion element and a micro-lens formed on the color filter, where a thickness of the color filter is greater in the center than in the periphery. Further, the color filters adjoin in vertical and horizontal directions in the arrangement of the unit pixel cells. A cross-sectional shape of the color filter is, for example, triangular, trapezoidal, convex, lens-shaped or semielliptic.

10 Claims, 19 Drawing Sheets

(e)

(f)

(g)

(h)

(a)

(b)

(c)

(d)

(e)

(f)

(d)

(e)

(f)

(d)

(e)

(f)

SOLID-STATE IMAGE SENSOR AND METHOD OF MANUFACTURING THEREOF

BACKGROUND OF THE INVENTION (1) Field of the Invention

The present invention relates to a solid-state image sensor in which unit pixel cells are arranged in a matrix, each cell including a photo-electric conversion element formed on a semiconductor substrate, and a color filter formed on the photo-electric conversion element. The present invention also relates to a method of manufacturing the solid-state image sensor.

(2) Description of the Related Art

Speaking of solid-state imaging sensors such as a Charge Coupled Device (CCD) sensor and a Metal Oxide Semiconductor (MOS) sensor, shortening of exit pupil distance between a lens of camera and the solid-state image sensor, and the miniaturization of cells are progressing, along with miniaturization of cameras and an increase in the pixel count of solid-state image sensors.

FIG. 1 is a cross-sectional view of the solid-state image sensor disclosed in Japanese Laid-Open Application No. 2001-249218. FIG. 1 shows a cross-sectional view of two unit pixels located particularly in the periphery of an imaging area. In the solid-state image sensor, a flattening film 14 such as a Boro-Phospho Silicated Glass (BPSG) is formed on a photodiode 11 of a photoelectric conversion unit, and an in-layer lens 3 is formed on the flattening film. In order to reduce variation in finishing of each color filter, a transparent film 4 is formed on the in-layer lens 3 for flattening the surface of the in-layer lens 3, while a color filter 2 is formed on the transparent film 4. The color filter 2 can be a color filter made of complementary colors such as yellow, cyan, magenta, and green, or a color filter made of primary colors such as red, green and blue. A micro-lens 1 and the color filter 2 are positioned offset toward the center of the imaging area, in order to increase an amount of oblique light received by the photodiode 11 in the periphery of the imaging area.

Color filter layers have conventionally been formed based on, for example, a dyeing method or a color resist method. In the color resist method, selective exposure and development processing are performed on a photo resist film that contains colorants and pigments, so as to form a color filter of intended color. Then, a transparent flattening film is formed below micro-lens for reducing the unevenness in the surface of the color filter after the formation of the color filter, which results in less variation in the formation of the micro-lens 1.

According to the improved example disclosed in the Japanese Laid-Open Application No. 2001-249218, thin-sliming of the complementary green filter, which is formed by a combination of cyan and yellow and is therefore very likely to be the thickest film among the color filter layers, is suggested. This is because the shortening of the distance between the surface of the semiconductor substrate and the transparent flattening film 13 that is located below the micro-lens is necessary as a solution to the problems such as degradation of luminous sensitivity to oblique light and color mixing caused between neighboring pixels, which are due to miniaturization of cells.

In the method of manufacturing a color filter, a color filter coating, which is a color filter component of the first color and does not contain a photosensitizing agent, is formed by selective etching. Therefore, for example, in the process of manufacturing a complementary color filter, by forming a green filter component using the same method as applied to the first color, it is possible to form a green filter component as thin as a filter component of other colors, which leads to thin-sliming of color filter layer.

However, along with the shortening of exit pupil distance between a lens of a camera and a solid-state image element it has been difficult, with the conventional solid-state image sensor, to reduce the degradation of light sensitivity and the color mixing caused between the neighboring pixels, by simply rendering the color filter thinner. This is because a cross-sectional shape of the color filter is not always finished by vertical cut: the firstly formed color filter has a trapezoidal shape (i.e. the upper base length is shorter than the lower base length) and secondly and thirdly formed color filters are inserted into the space where color filters are not yet formed. As a result, oblique incident light passes through the edge of the color filter of the neighboring pixel, as shown in FIG. 2A, and desired spectral characteristics cannot be obtained. Another problem with the conventional cross-sectional shape is that an alignment margin decreases as the miniaturization of solid-state image sensors progresses. In the case where a color filter and a micro-lens are not properly aligned, color mixing is caused by the fact that the oblique incident light passes the edge of the color filter of the neighboring pixel, as shown in FIG. 2B, and desired spectral characteristics cannot be obtained. Further problems such as color density difference between lines, flicker, color shading, and variation in sensitivity are caused since the degree of color mixing varies depending on the angle at which the incident light passes. The color density difference between lines is a difference in density of color between the neighboring lines caused by the difference in the degree of color mixing between lines due to the different arrangement of colors in each line. The flicker attributes to a spectral difference between fields due to color mixing in the case of complementary color filter. The color shading is a phenomenon that the color differently develops between in the periphery of the imaging area and in the center.

As described above, technology which prevents decrease in light sensitivity that is a main characteristic of the solid-state image sensors as well as other characteristics such as color mixing between the neighboring pixels, a color density difference between lines, flicker and color shading is needed as the miniaturization of solid-state image sensors progress.

SUMMARY OF THE INVENTION

An object of the present invention is to provide a solid-state image sensor that reduces the characteristics such as color mixing, color density difference between lines, flicker and color shading, as well as the method of manufacturing such solid-state image sensor.

In order to achieve the above object, the solid-state image sensor according to the present invention includes unit pixel cells arranged in a matrix form, wherein each of the unit pixel cells includes a photoelectric conversion element formed on a semiconductor substrate, a color filter formed on the photoelectric conversion element and a micro-lens formed on the color filter, and a thickness in the center of the color filter is greater than a thickness in the periphery.

According to this structure, when oblique light passes through a color filter layer, there is less influence from the neighboring color filter layer even when a color filter and a micro-lens are not properly aligned due to miniaturization of solid-state image sensors. In particular, it is possible to prevent color mixing that is likely to occur in the periphery of the imaging area, improve color density difference between lines, flicker and color shading, and to reduce variation in sensitivity.

The color filter may adjoin other color filters in vertical and horizontal directions in the arrangement of the unit pixel cells.

According to this structure, the color filters that neighbor at least in vertical and horizontal direction of the arrangement are adjoining, and the periphery of the joint is thinner than the center. It is therefore possible to reduce color mixing without decreasing the miniaturization level of the image sensor, and enhance a color sensitivity characteristic of the image sensor.

A cross-section of the color filter may have a trapezoidal shape, a step-like shape which descends from the center of said color filter to the periphery, or an upward convex lens shape.

A method of manufacturing a solid-state image sensor including unit pixel cells arranged in a matrix form, each unit pixel cell having a photoelectric conversion element, wherein the method includes: a first step of forming a color filter on the photoelectric conversion element; and a second step of forming a micro-lens on the color filter, wherein a thickness in the center of the color filter is greater than a thickness in the periphery.

The second step may include: applying a color filter resist; exposing the applied color filter resist using a grey-tone mask; and forming a color filter by developing the exposed color filter resist, wherein the grey-tone mask may have a tone pattern whose density varies depending on thicknesses in a cross-section of each color filter.

According to this structure, an amount of exposure can be arbitrarily adjusted according to the tone of grey-tone mask, and the color filter can be formed in such a manner that the thickness of the cross-sectional shape of the color filter resist is thinner in the periphery than in the center.

The grey-tone mask may have a tone pattern by which the color filter is formed adjoining other color filters in vertical and horizontal directions in the arrangement of the unit pixel cells.

According to this structure, it is possible to manufacture the solid-state image sensor in such a manner that the color filters that neighbor at least in vertical and horizontal directions of the arrangement are joined, reduce color mixing without decreasing the miniaturization level of the image sensor, and enhance the color sensitivity characteristic.

The grey-tone mask may have the following patterns: a tone pattern whose density varies depending on thicknesses in a cross-section of a color filter, having a trapezoidal shape; a tone pattern whose density varies depending on thicknesses of a cross-section of a color filter, having a step-like shape which descends from the center of the color filter to the periphery; and a tone pattern whose density varies depending on thicknesses of a cross-section of a color filter, having an upward convex lens shape.

A cross-section of the color filter may have a step-like shape which descends from the center of the color filter to the periphery, the second step may include: applying a color filter resist; exposing the applied color filter resist using a first mask; developing the exposed color filter resist so as to form a lower step of the color filter; further applying a color filter resist; exposing the further applied color resist using a second mask; and developing the exposed color filter resist so as to form an upper step of the color filter, and the second mask may have a pattern adapted for the upper step having a top surface area smaller than a top surface area of the lower step.

As described above, when oblique light passes a color filter layer, it is possible, with the solid-state image sensor according to the present invention, to reduce the color mixing caused between the neighboring color filter layers. It is also possible to prevent color mixing even in the case where a color filter and a micro-lens are not properly aligned, improve color density difference between lines, flicker and color shading, and to reduce variation in sensitivity, so that miniaturization of image sensors can be further achieved.

Further Information about Technical Background to this Application

The disclosure of Japanese Patent Application No. 2004-243712 filed on Aug. 24, 2004, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DETAILED DESCRIPTION OF THE INVENTION

The following describes the solid-state image sensor according to the embodiment of the present invention, with reference to the diagrams. FIGS. 3 through 6 are diagrams showing the first to fourth structural examples of the solid-state image sensor according to the present embodiment. The solid-state image sensor as described in the above examples has unit pixel cells arranged in a matrix form. FIGS. 3 through 6 respectively shows a cross-sectional view of two unit pixel cells that are located close to the center of the imaging area formed by the arrangement of the unit pixel cells. The solid-state image sensor is structured as follows: a flattening film 14 such as a BPSG is formed on the photodiode (photoelectric conversion element) 11; and an in-layer lens 3 is formed on the flattening film 14. After flattening the in-layer lens 3 using a transparent in-layer lens flattening film 4 made of, for instance, acryl, a color filter 2 is formed on the in-layer lens 3 in order to reduce variation in finishing of each color filter.

The cross-sectional shape of each color filter 2 is formed so that the thickness gets thinner from the center of the cell towards the periphery of the cell, or the thickness in the periphery of the cell is thinner than that in the center.

The bottom dimension of the cross-section of the color filter 2 is formed in such a manner that the dimension is as same as the cell size in vertical and horizontal directions in the arrangement of the unit pixel cells. That is to say that the color filter 2 is joined to another color filter in vertical and horizontal directions in the arrangement of the unit pixel cells.

Figure 3:
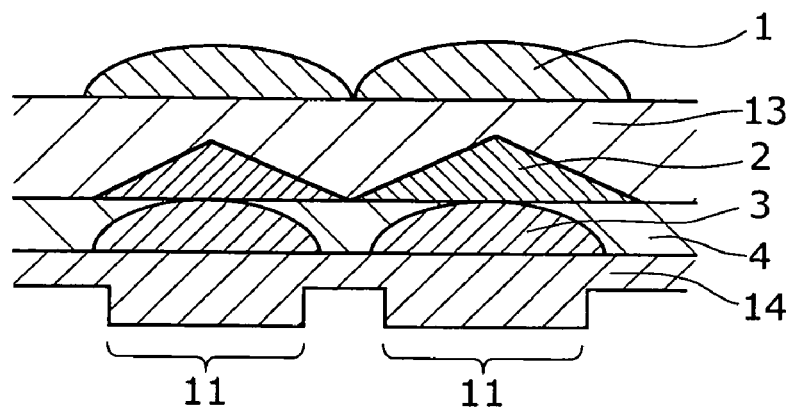
FIG. 3 is a diagram showing a cross-sectional structure of a solid-state image sensor in which a cross-sectional shape of a color filter is triangle, according to the embodiments of the present invention.
Figure 4:
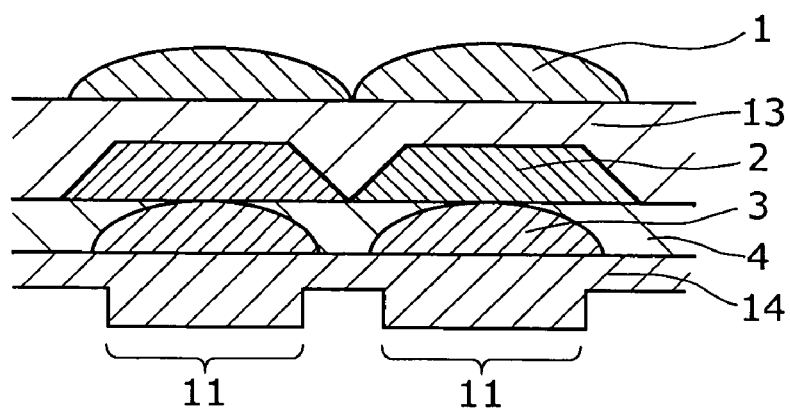
FIG. 4 is a diagram showing a cross-sectional structure of a solid-state image sensor in which a cross-sectional structure of a color filter has a trapezoidal shape.
Figure 5:
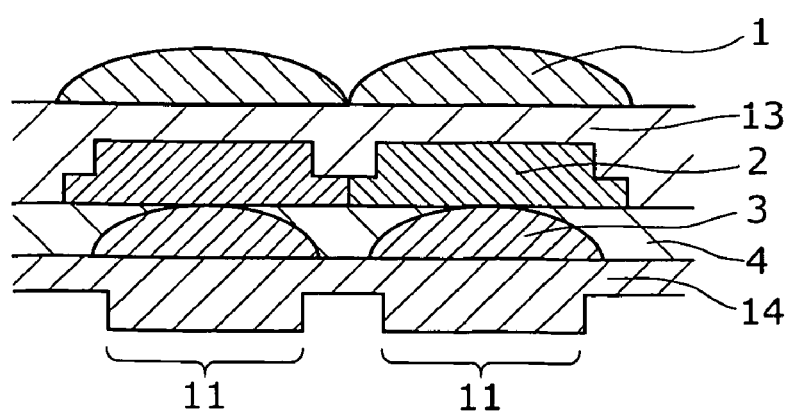
FIG. 5 is a diagram showing a cross-sectional structure of a solid-state image sensor in which a cross-sectional structure of a color filter has a step-like shape.

The following describes the structure of the solid-state image sensor with reference to FIGS. 3 to 5.

FIG. 3 shows a structural example of the solid-state image sensor according to the embodiment. The flattening film 14 such as a BPSG is formed on the photodiode 11, and the in-layer lens 3 is formed on the flattening film 14. After flattening the in-layer lens 3 using the transparent in-layer lens flattening film 4 made of, for instance, acryl, the color filter 2 is formed on the in-layer lens 3 in order to reduce variation in finishing of each color filter.

The cross-sectional structure of the color filter 2 has a triangle shape. Namely, the cross-sectional shape of each color filter is formed so that the thickness of the filter gets thinner from the center of the cell towards the periphery. Then, the part located above the color filter is flattened by a transparent flattening film 13 made of acryl, for instance, and a micro-lens resist is applied thereto. After the application of the micro-lens resist, mask exposure and development are carried out so as to selectively form a resist in the part where a micro-lens 1 is formed in each pixel. Then, decolorizing using ultraviolet, and thermal flow processing are performed to the resist.

By allowing the cross-sectional structure of the color filter 2 to have a trapezoidal shape, as illustrated in FIG. 4, in which an upper base is longer than a lower base, oblique incident light cannot easily pass the edge of the neighboring color filter when the light passes the color filter. Moreover, even when the color filter 2 and the micro-lens 1 are not properly aligned, the light passing the edge of the color filter 2 cannot easily pass the edge of the neighboring pixel. The trapezoidal shape applied to the color filter 2 is therefore effective for the prevention of color mixing.

FIG. 5 shows the third example of the structure of the solid-state image sensor of the present embodiment. The flattening film 14 such as a BPSG is formed on the photodiode 11, and the in-layer lens 3 is formed on the flattening film 14. After flattening the in-layer lens 3 using the transparent in-layer lens flattening film 4 made of, for instance, acryl, the color filter 2 is formed on the in-layer lens 3 in order to reduce variation in finishing of each color filter. The cross-sectional structure of the color filter 2 has a step-like shape. Namely, the cross-sectional shape of each color filter is formed so that the thickness of the filter becomes thinner from the center of the cell towards the periphery. Then, the part located above the color filter is flattened by the transparent flattening film 13 made of acryl, for instance, and a micro-lens resist is applied thereto. After the application of the micro-lens resist, mask exposure and development are carried out so as to selectively form a resist in the part where a micro-lens 1 is formed in each pixel. Then, decolorizing using ultraviolet, and thermal flow processing are performed to the resist.

By allowing the cross-sectional structure of the color filter 2 to have a step-like shape, oblique incident light cannot easily pass the edge of the neighboring color filter when the light passes the color filter. Moreover, even when the color filter 2 and the micro-lens 1 are not properly aligned, the light passing the edge of the color filter 2 cannot easily pass the edge of the neighboring pixel. The step-like shape applied to the color filter 2 is therefore effective for the prevention of color mixing.

Figure 6:
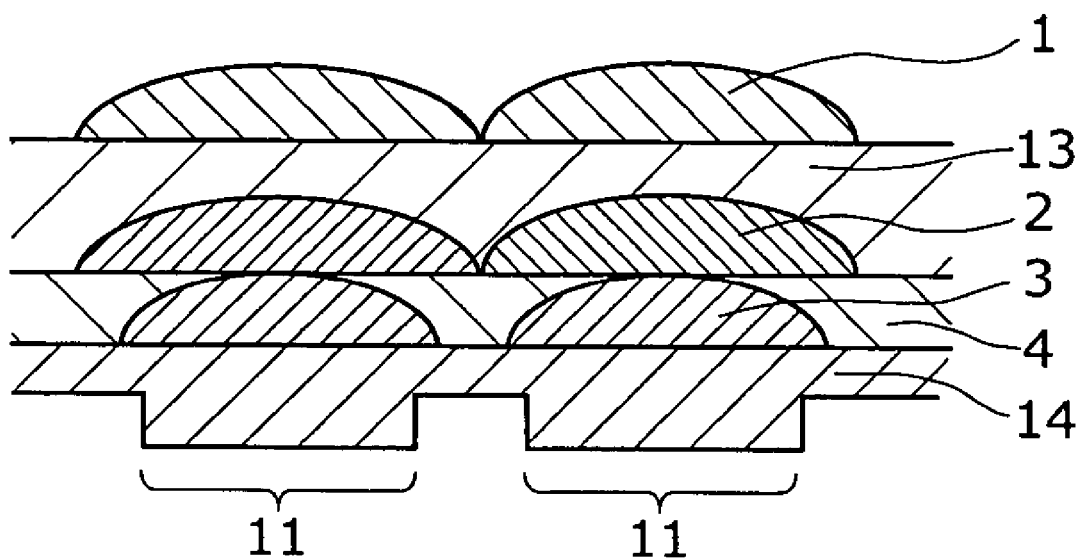
FIG. 6 is a diagram showing a cross-sectional structure of a solid-state image sensor in which a cross-sectional structure of a color filter has a lens shape.

FIG. 6 shows the fourth example of the structure of the solid-state image sensor according to the embodiment. The flattening film 14 such as a BPSG is formed on the photodiode 11, and the in-layer lens 3 is formed on the flattening film 14. After flattening the in-layer lens 3 using the transparent in-layer lens flattening film 14 made of, for instance, acryl, the color filter 2 is formed on the in-layer lens 3 in order to reduce variation in finishing of each color filter. The cross-sectional structure of the color filter 2 is a semielliptic structure as is the cross-sectional structure of the micro-lens 2. Namely, the cross-sectional shape of the color filter is formed so that the thickness of the filter becomes thinner from the center of the cell towards the periphery. Then, the part located above the color filter is flattened by the transparent flattening film 13 made of acryl, for instance, and a micro-lens resist is applied thereto. After the application of the micro-lens resist, mask exposure and development are carried out so as to selectively form a resist in the part where a micro-lens 1 is formed in each pixel. Then, decolorizing using ultraviolet, and thermal flow processing are performed to the resist.

By allowing the cross-sectional structure of the color filter 2 to be a semielliptic structure, oblique incident light cannot easily pass the edge of the neighboring color filter when the light passes the color filter. Moreover, even when the color filter 2 and the micro-lens 1 are not properly aligned, the light passing the edge of the color filter 2 cannot easily pass the edge of the neighboring pixel. The semielliptic structure applied to the color filter 2 is therefore effective for the prevention of color mixing.

By applying one of the structures described above as the first to fourth examples to the solid-state image sensor according to the present embodiment, it is possible to prevent color mixing between the neighboring color filter layers caused when oblique light passes a color filter layer. Color mixing can be prevented even in the case where the color filter 2 is not properly aligned. Moreover, it is possible to reduce color density difference between lines, flicker, color shading and reduce variation in sensitivity.

The following describes a method of manufacturing the respective color filters of the solid-state image sensors as shown in FIGS. 3 through 6.

In the case of using any of the cross-sectional shapes of the color filter 2 as described in the first through fourth examples of the solid-state image sensor with reference to FIGS. 3 through 6, a color filter is formed by applying a color filter resist onto the in-layer lens flattening film 4, and developing the resist after the exposure of the resist using a grey-tone mask. The grey-tone mask provides tone patterns that vary depending on the cross-sectional shape of the color filter. Note that dyeing is also carried out if a dyeing process is necessary.

The grey-tone mask will be described in the following. The existing mask has a black and white pattern used for leaving or removing resist. In contrast, the grey-tone mask is used for leaving resist for the part where a film should be formed, by adjusting an amount of exposure according to the degree of greyness. With the use of such grey-tone mask, the thickness of the film to be eventually formed can be adjusted. That is to say, it is possible to leave the resist for the part where a film should be formed, but resist is not "completely removed or left". For example, in the case of forming the micro-lens 1 using the general existing mask, patterning is performed using the mask after the application of the resist so that a rectangular shape is formed. Then, the formation of micro-lens 1 is completed after thermal flow is performed. However, in the case of using the grey-tone mask, a mask pattern being a grey pattern, a lens shape can be obtained after the exposure and development of resist, by using a grey pattern mask with which necessary film remains.

With the use of the grey-tone mask, the cross-sectional shape of the color filter 2 can be flexibly adjusted.

FIGS. 7(a) through 7(e) are diagrams for describing a process of the manufacturing method 1 of the solid-state image sensor sown in FIGS. 3 through 6. FIGS. 7(a) through 7(e) show the case where a color filter resist is a positive type. The triangle shape shown in FIG. 3 is a typical example of the cross-sectional shape of the color filter 2. The following describes the process.

As shown in FIG. 7(a), the flattening film 14 such as a BPSG is formed on the photodiode 11, and the in-layer lens 3 is formed on the flattening film 14. After flattening the in-layer lens 3 using the transparent in-layer lens flattening film 14 made of, for instance, acryl, the color filter 2 is formed on the in-layer lens 3 in order to reduce variation in finishing of each color filter.

As shown in FIG. 7(b), exposure and development are carried out using a grey-tone mask 6. Here, dyeing is also performed in the case where a dyeing process is required.

FIG. 7(c) shows the pattern resulted from the development.

As shown in FIG. 7(d), color filters of other colors are formed in the same manner by repeating the process shown in FIGS. 7(a) and 7(b).

As shown in FIG. 7(e), the transparent film 13 is formed on the color filter 2. The micro-lens 1 is further formed on the transparent film 13 by the application of a micro-lens resist, exposure, development and thermal flow.

It should be noted that any one of the cross-sectional shapes of the color filter which are shown in FIGS. 4 through 6 can be formed by using the grey-tone mask that has a pattern corresponding to the intended shape among the shapes shown in FIGS. 4 through 6.

FIGS. 8(a) through 8(e) is a diagram for describing a process of the manufacturing method 2 of the solid-state image sensor shown in FIGS. 3 through 6. FIGS. 8(a) through 8(e) shows the case where a color filter resist is a negative type. The triangle shape shown in FIG. 3 is a typical example of the cross-sectional shape of the color filter 2. The difference between the process shown in FIGS. 7(a) through 7(e) and the process shown in FIGS. 8(a) through 8(e) is that a tone pattern of the grey-tone mask shown in FIGS. 7(b) and 8(b) has opposite characteristics due to the use of the negative-type resist. Apart from this point, the process is same so that the description is not repeated here.

Figure 9A:
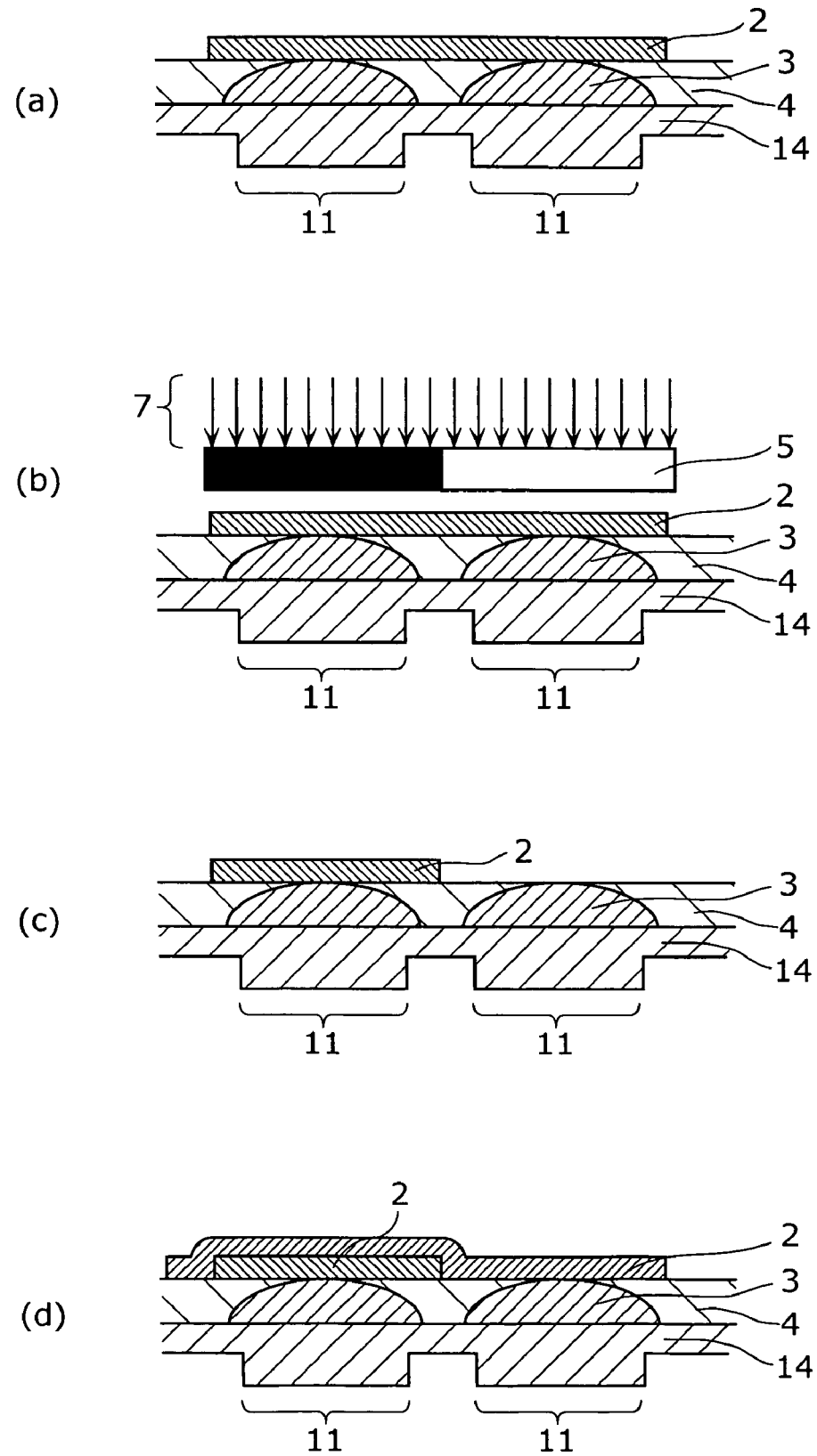
FIG. 9A is a diagram showing a method of manufacturing a solid-state image sensor in which a cross-sectional structure of a color filter has a step-like shape.
Figure 9B:
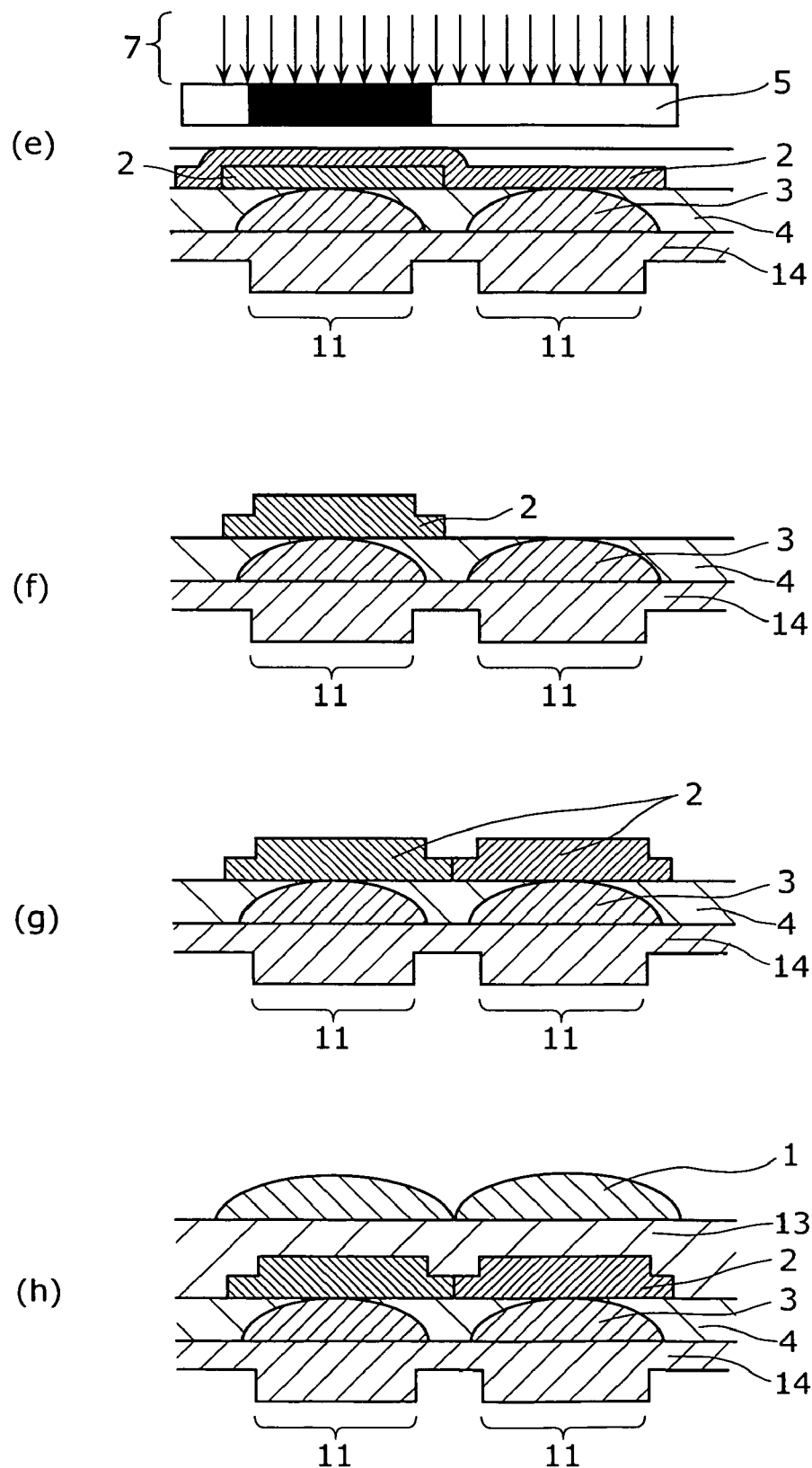
FIG. 9B is a diagram showing the manufacturing method continued from FIG. 9A.

FIGS. 9A and 9B are diagrams showing a process of manufacturing the solid-state image sensor of the third example (step-like shape) shown in FIG. 5. FIGS. 9A and 9B show the case where a color filter resist is a positive type. The following describes the process.

As shown in FIG. 9A (a), the flattening film 14 such as a BPSG is formed on the photodiode 11, and the in-layer lens 3 is formed on the flattening film 14. After flattening the in-layer lens 3 using the transparent flattening film 4 made of, for instance, acryl, a color filter resist is applied. The thickness of the color filter resist to be applied may be ½ to ⅔ (e.g., 0.5-0.75 μm) of the thickness in the case shown in FIGS. 7 and 8.

As shown in FIG. 9A (b), exposure and development are carried out using a mask 5. Dyeing is performed in the case where a color filter resist is a dyeing type.

FIG. 9A (c) shows a cross section of the color filter after the development (or dyeing).

Figure 7:
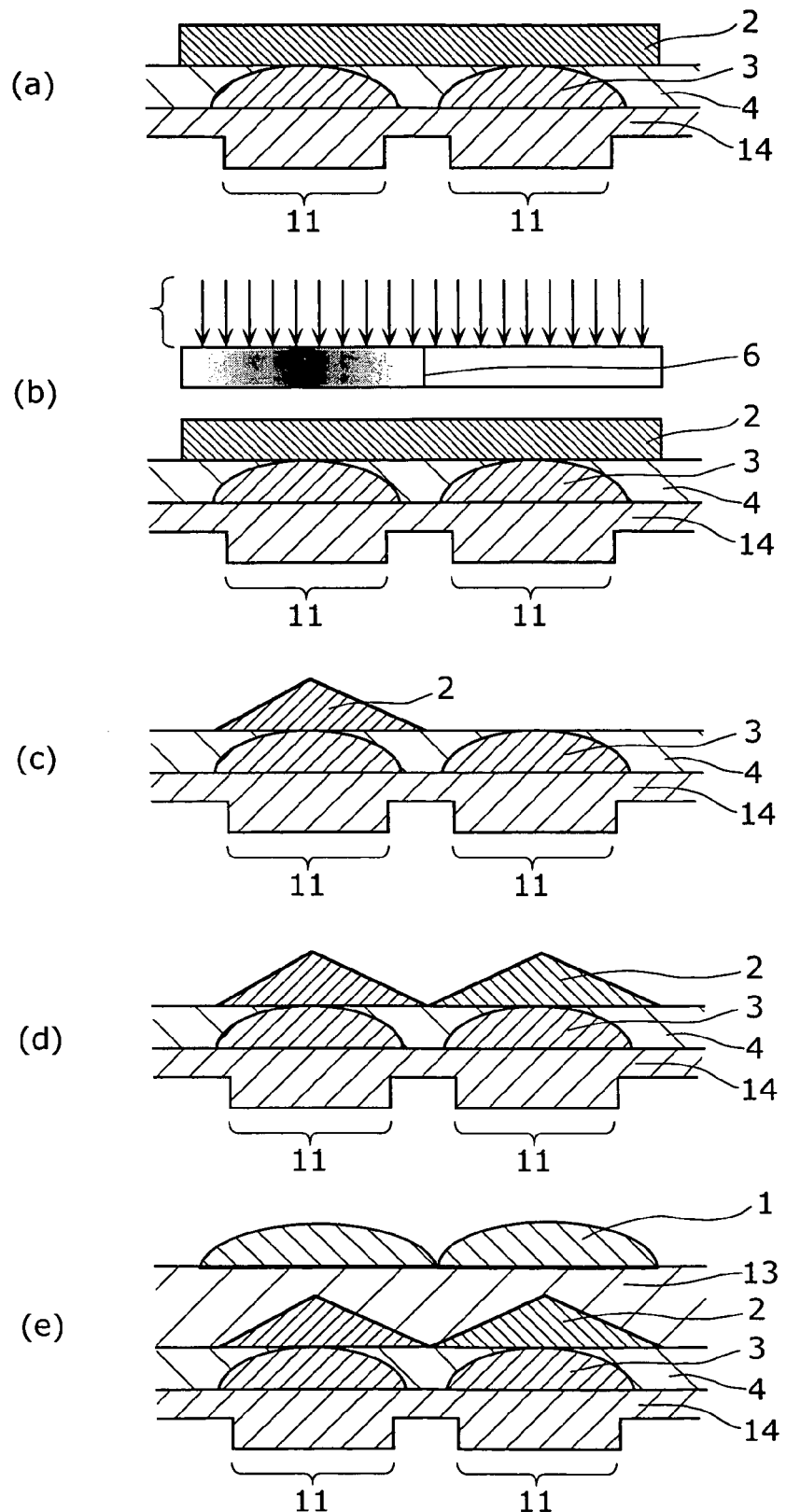
FIG. 7 is a diagram showing a method of manufacturing a solid-state image sensor in which a color filter is formed by grey-tone mask in the case where a resist is a positive type.
Figure 8:
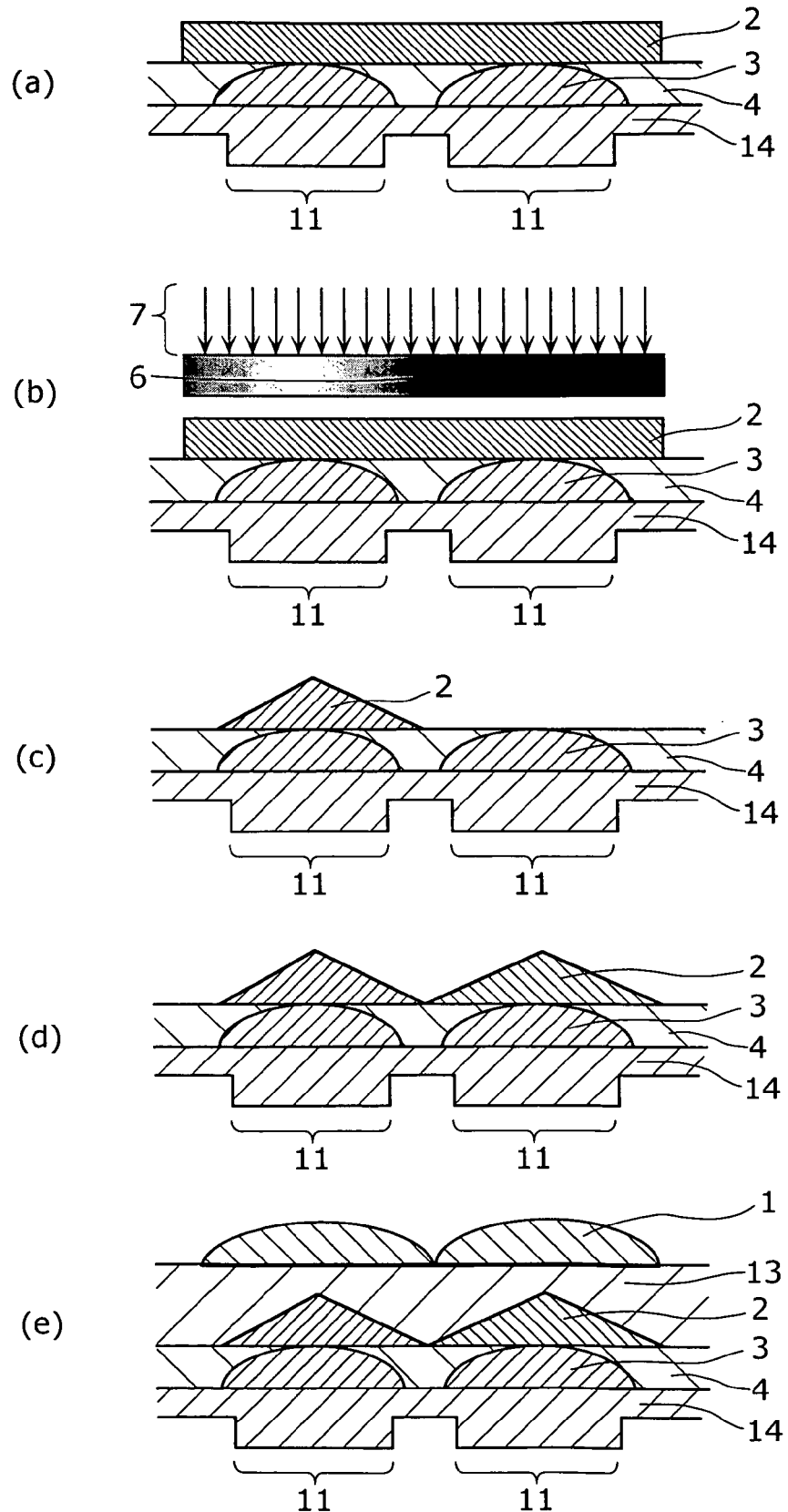
FIG. 8 is a diagram showing a method of manufacturing a solid-state image sensor in which a color filter is formed by grey-tone mask in the case where a resist is a negative type.

As shown in FIG. 9A (d), the color filter resist of the same color is re-applied, The thickness of the resist to be applied may be equal to or less than ½ (e.g., 0.5 μm) of the thickness in the case shown in FIGS. 7 and 8.

As shown in FIG. 9B (e), a mask whose dimension of a black pattern is smaller than the mask used in FIG. 9A (b) is used for exposure and development. Note that the same mask as used in FIG. 9A (b) may be used so that the period of exposure is longer.

FIG. 9B (f) shows a cross section of the color filter after the development (or dyeing).

As shown in FIG. 9B (g), other color filters are formed in the same manner as in the process shown in FIG. 9A (a) through 9B (e).

As shown in FIG. 9B (h), after the application of the transparent film 13 on the color filter 2, the micro-lens 1 is formed through the application of the micro-lens resist, exposure, development and decolorizing (or thermal flow).

In this way, the solid-state image sensor of the third example (step-like shape) as shown in FIG. 5 can be formed by stacking the color filters in two stages. In such case, the image sensor can be manufactured using a black and white mask without necessity to use a grey-tone mask.

Figure 10A:
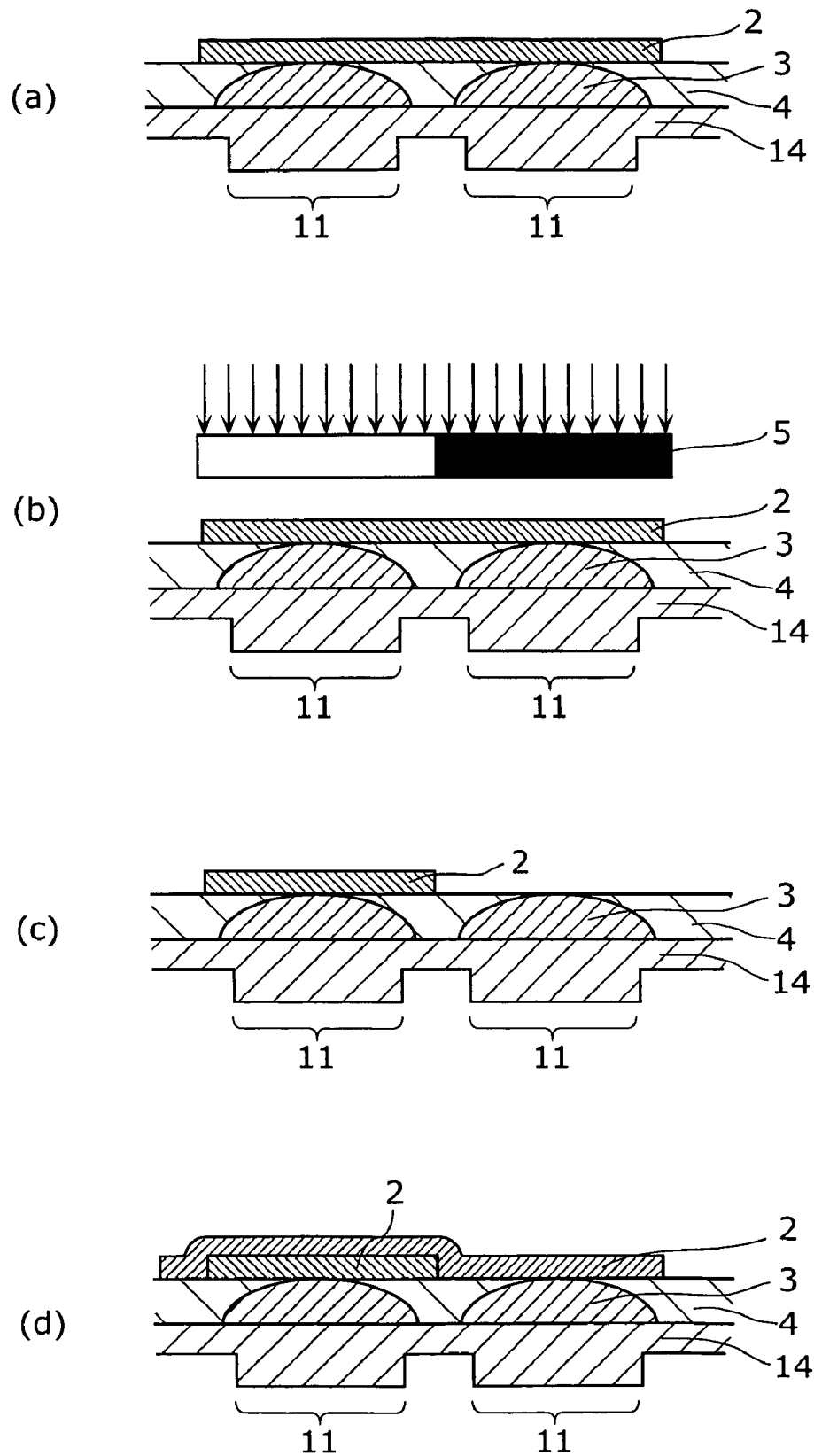
FIG. 10A is a diagram showing a method of manufacturing a solid-state image sensor in which a cross-sectional structure of a color filter has a step-like shape in the case where a resist is a negative type.
Figure 10B:
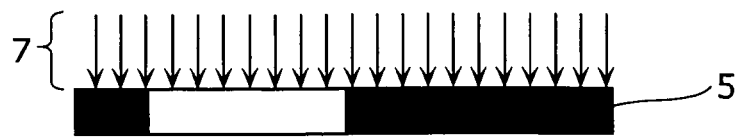
FIG. 10B is a diagram showing the manufacturing method continued from FIG. 10A.
Figure 10B:
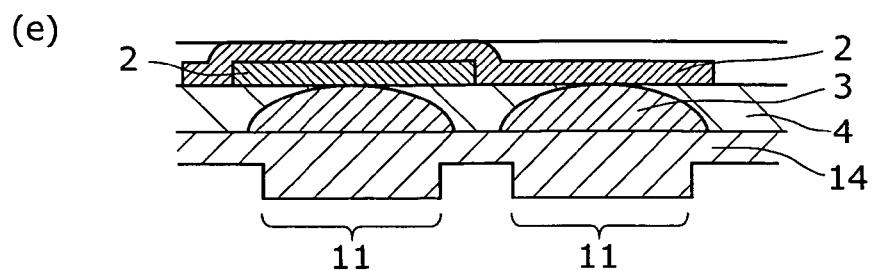
Figure 10B:
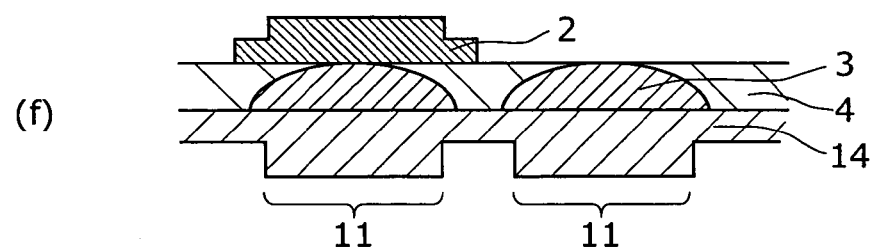
Figure 10B:
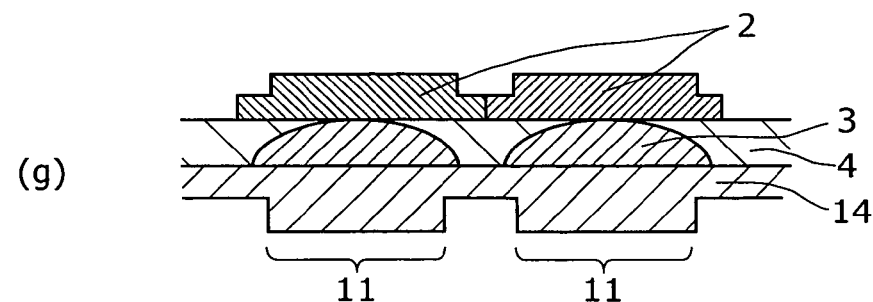
Figure 10B:
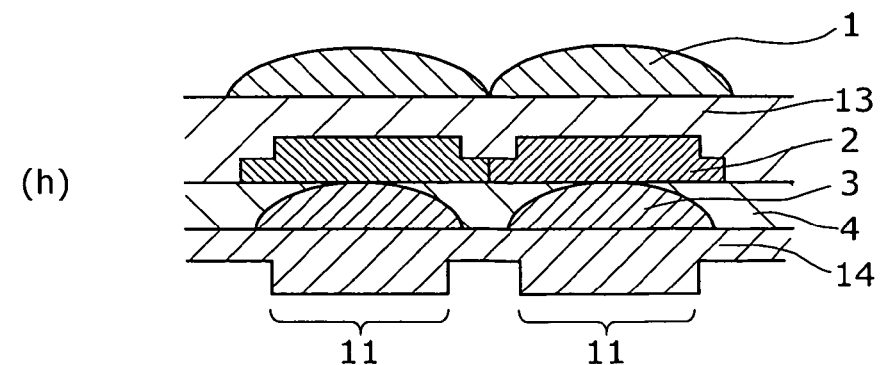

FIGS. 10A and 10B are diagrams for describing a process of manufacturing the solid-state image sensor of the third example (step-like shape) as shown in FIG. 5. FIGS. 10A and 10B show the case where a color filter resist is a negative type. The difference between the process shown in FIGS. 10A and 10B and the one shown in FIGS. 9A and 9B is that the black and white mask patterns used in (b) and (e) have opposite characteristics due to the use of the negative-type resist. Apart from this point, the process is same so that the description is not repeated here.

Note that in the process shown in FIG. 9B (e) where a positive-type resist is used, the exposure and development may be performed under the conditions that the same mask as used in the process shown in FIG. 9A (b) is used and the exposure time is as same as or longer than the time required of the first exposure (FIG. 9A (b)). In the process shown in FIG. 10B (e) where a negative-type resist is used, the exposure and development are performed under the condition that the exposure time is as same as or shorter than the time required of the first exposure (FIG. 10A (b)). In the case where the exposure time is fixed, a mask whose dimension of color filter becomes smaller may be used so that the shape with a pattern smaller than the pattern of the color filter formed for the first time is formed. After the formation of the pattern, dyeing is also performed in the case where a dyeing process is required.

Figure 11A:
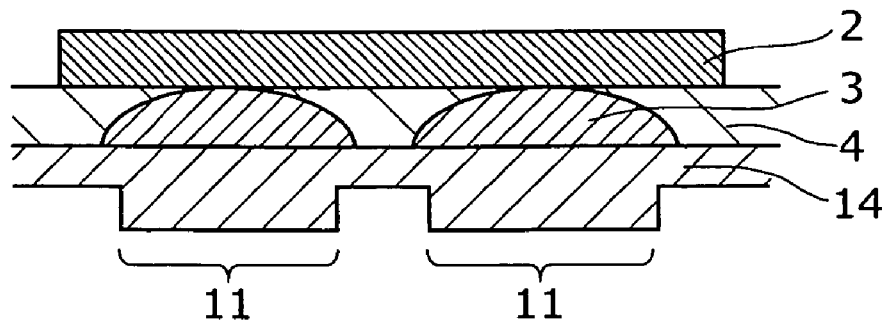
FIG. 11A is a diagram showing a manufacturing method 1 of a solid-state image sensor in which a cross-sectional structure of a color filter has a lens shape.
Figure 11A:
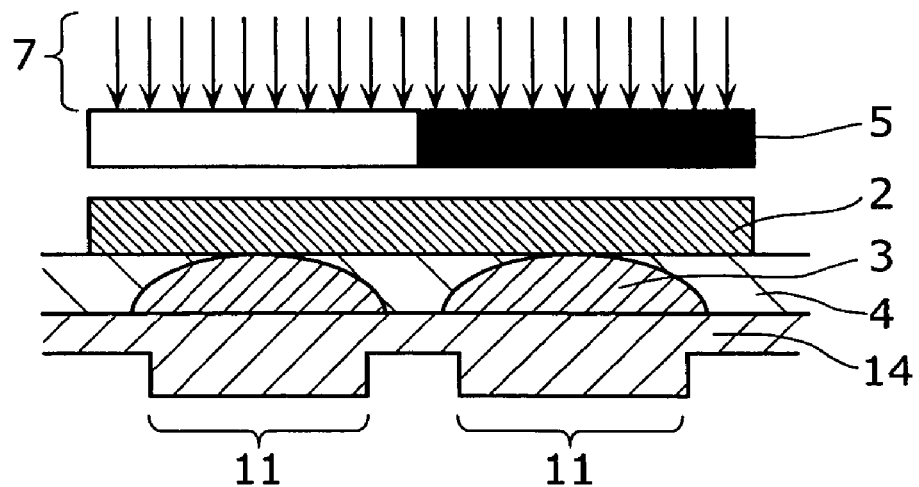
Figure 11A:
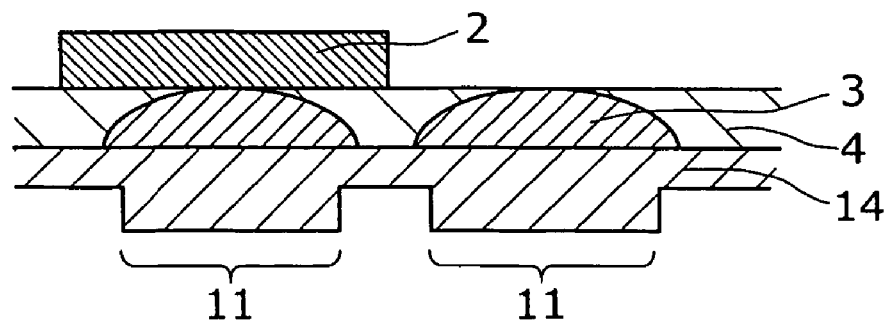
Figure 11B:
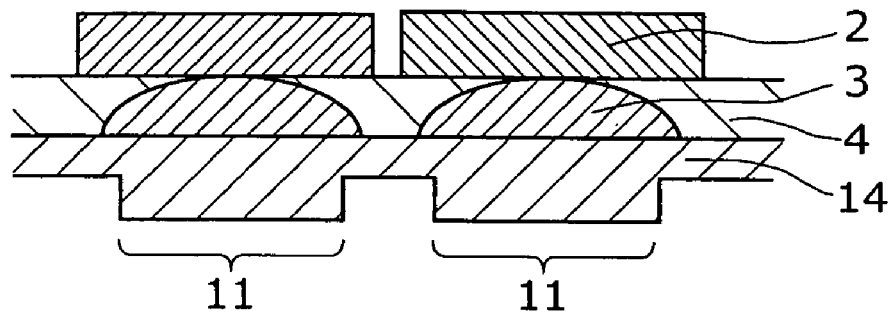
FIG. 11B is a diagram showing the manufacturing method continued from FIG. 11A.
Figure 11B:
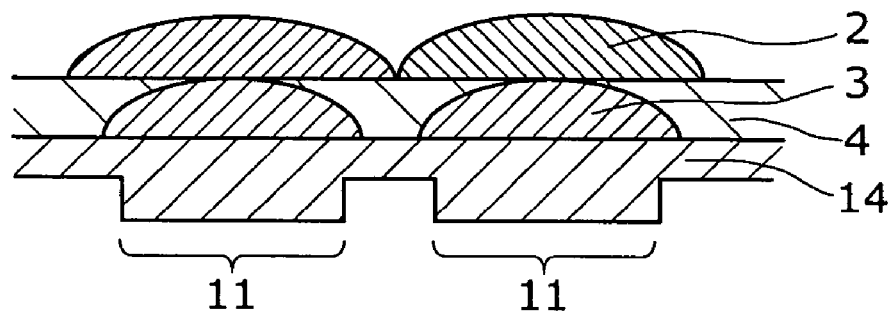
Figure 11B:
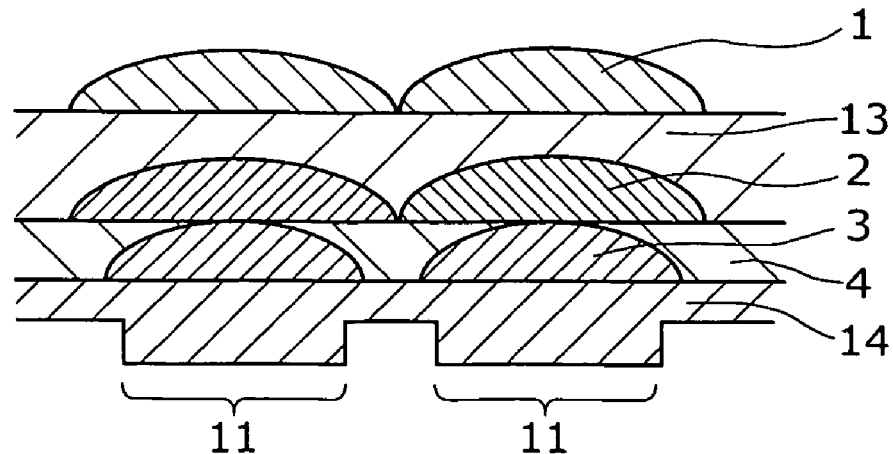

FIGS. 11A and 11B are diagrams for describing a process of the manufacturing method 1 for the solid-state image sensor of the fourth example (lens shape) shown in FIG. 6. The following describes the process.

As shown in FIG. 11A (a), a color filter resist that can be subjected to thermal flow processing is applied onto the flattening film 4 formed on the in-layer lens 3.

As shown in FIG. 11A (b), the color filter resist that can be subjected to the thermal flow processing is formed, through the exposure and development, in the place defined by color arrangement.

FIG. 11A (c) shows the color filter resist that can be subjected to thermal flow processing, which is formed through the development.

As shown in FIG. 11B (d), the color filter resists of other colors are formed through the application, exposure and development in the same manner as shown in FIGS. 11A (a) and 11A (b). Dyeing is performed in the case where a dyeing process is required.

As shown in FIG. 11B (e), the color filter resist is hardened by finishing it up to have a lens shape or a semielliptic shape by thermal flow processing.

As shown in FIG. 11B (f), the transparent film 13 and the micro-lens 1 are formed on the color filter 2.

Figure 12A:
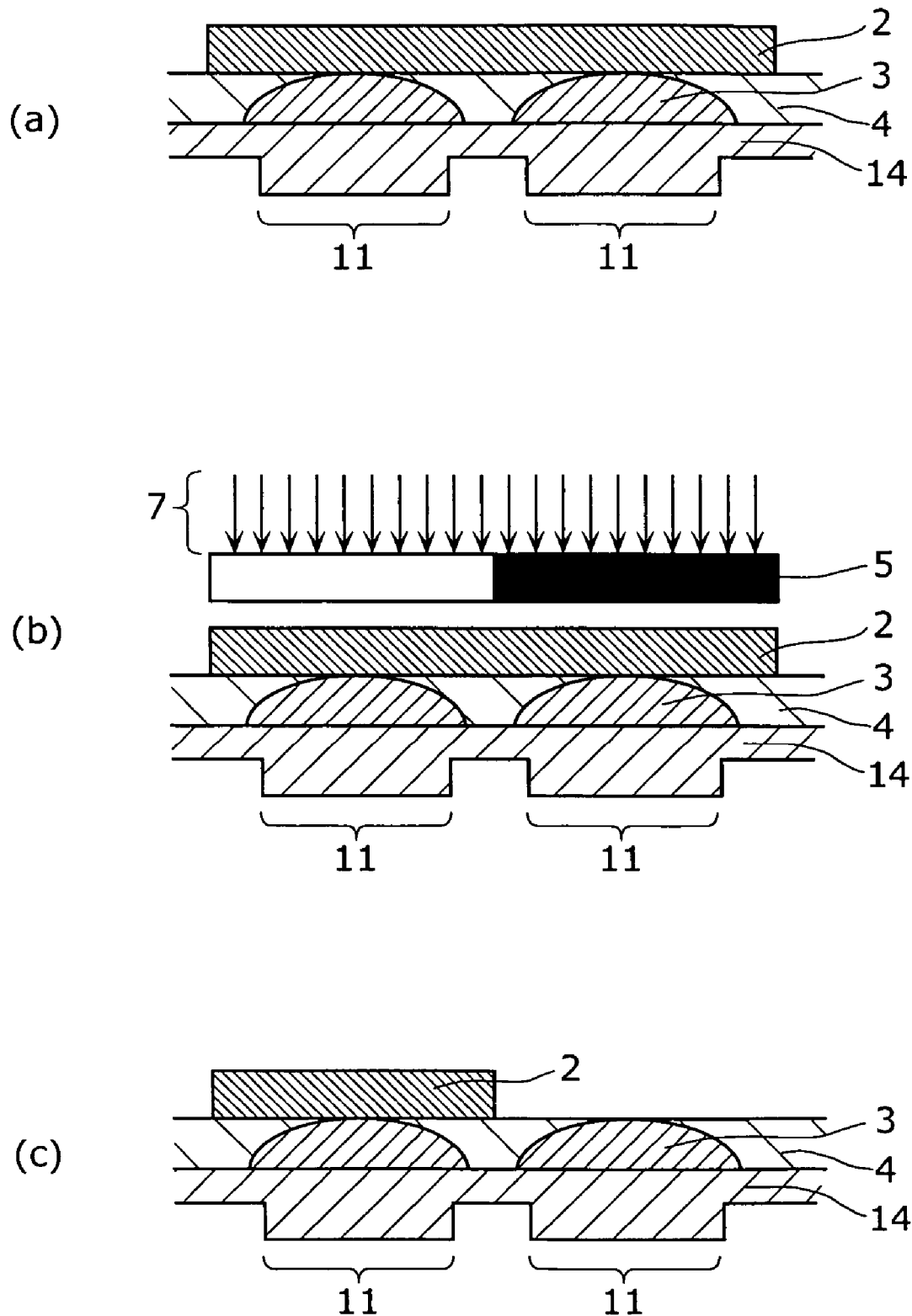
FIG. 12A is a diagram showing a manufacturing method 2 of a solid-state image sensor in which a cross-sectional structure of a color filter has a lens shape.
Figure 12B:
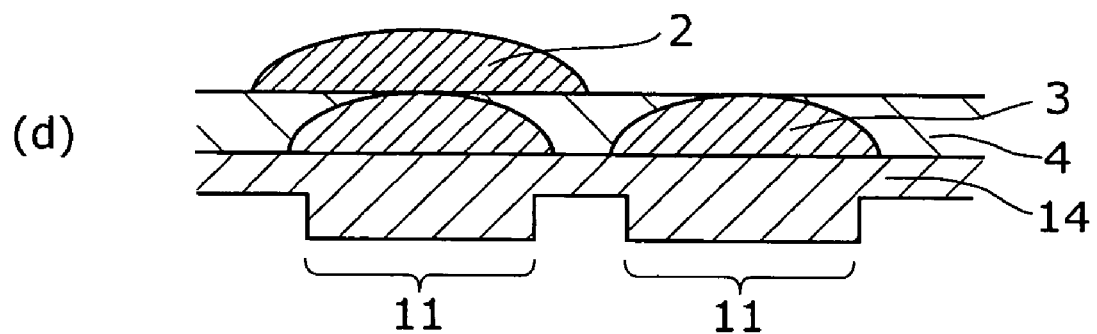
FIG. 12B is a diagram showing the manufacturing method continued from FIG. 12A.
Figure 12B:
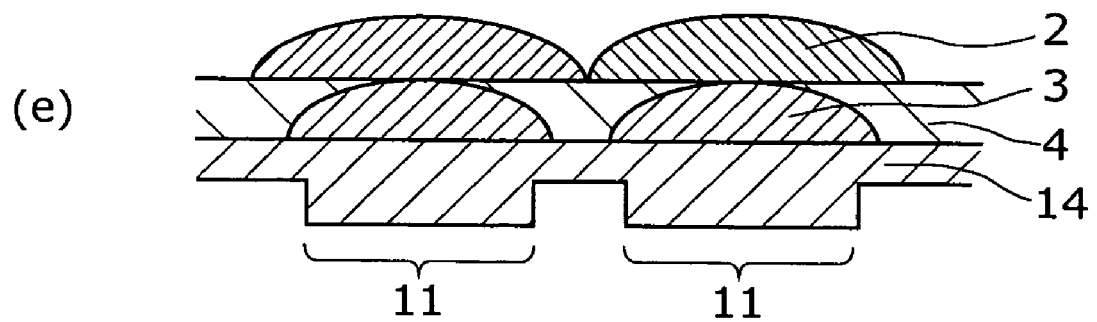
Figure 12B:
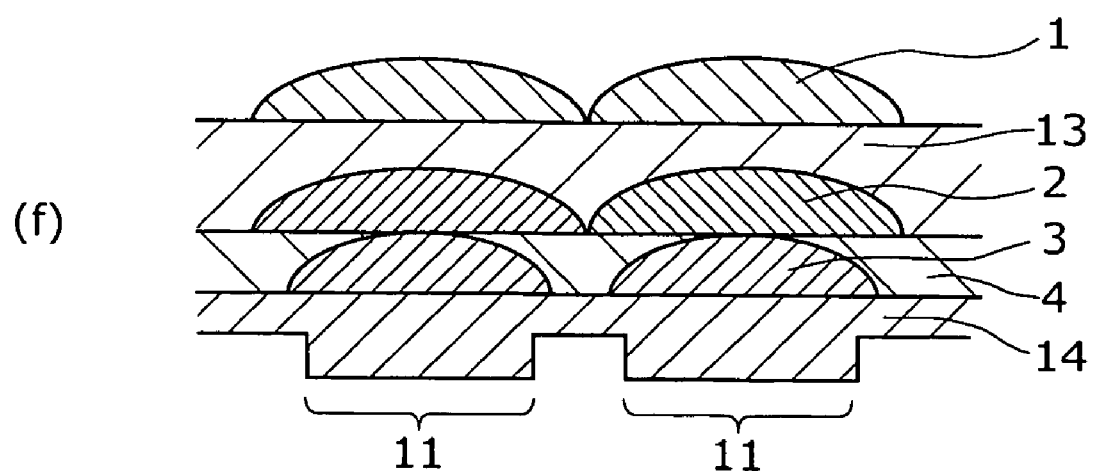

FIGS. 12A and 12B are diagrams for describing a process of the manufacturing method 2 for the solid-state image sensor of the fourth example (lens shape) shown in FIG. 6. The following describes the process.

As shown in FIG. 12A (a), the color filter resist 2 that can be subjected to thermal flow processing is applied onto the flattening film 4 formed on the in-layer lens 3.

As shown in FIG. 12A (b), the color filter resist that can be subjected to the thermal flow processing is formed, through the exposure and development, in the place defined by color arrangement.

FIG. 12 A (c) shows the color filter resist that can be subjected to the thermal flow processing, which is formed through the development.

As shown in FIG. 12 B (d), the color filter resist is hardened by finishing it up to have a lens shape or a semielliptic shape by thermal flow. Note that dyeing may be performed after the thermal flow processing in the case where a dyeing process is required.

As shown in FIG. 12 B (e), the color filters of other colors are formed through the application, exposure, development, thermal flow and hardening in the same manner as shown in FIGS. 12A (a) through FIG. 12B (d).

As shown in FIG. 12B (f), the transparent film 13 and the micro-lens 1 are formed on the color filter 2.

Thus, in the case where the cross-sectional shape of the color filter 2 has a semielliptic structure as can be seen in the cross-sectional shape of the micro-lens, a color filter resist is applied onto the in-layer lens flattening film 4. After the use of a grey-tone mask, the exposure, development are performed on the color filter resist so that the cross-sectional shape of the color filter 2 becomes a semielliptic shape as seen in the cross-sectional shape of the micro-lens 1. Dyeing is also performed in the case where a dyeing process is required.

Note that in the formation of the color filter 2, the color filter 2 may be finished to have a semielliptic shape by applying the color filter resist onto the flattening film 4 of the in-layer lens, performing exposure and development on the color filter resist using a material that can be subjected to thermal flow processing, and then, carrying out thermal flow processing. The thermal flow processing may be performed onto all the color filters 2 after the formation of all the color filters 2, so that the lens shapes are formed for them all, as shown in FIG. 11, or the process of application, exposure, development and thermal flow may be repeated for each color so as to form a lens shape for each color filter, as shown in FIG. 12.

Figure 13A:
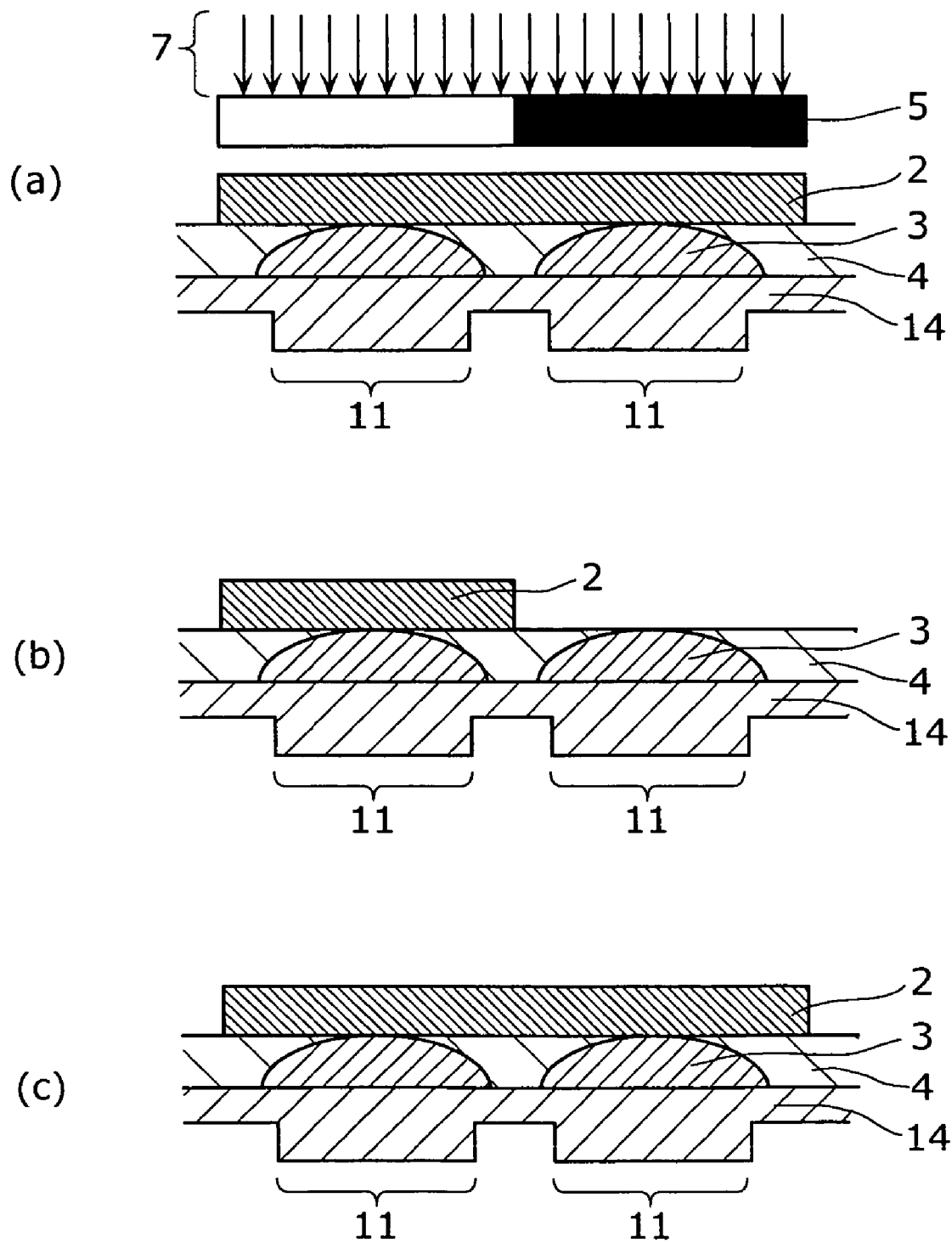
FIG. 13A is a diagram showing a manufacturing method 3 of a solid-state image sensor in which a cross-sectional structure of a color filter has a lens shape.
Figure 13B:
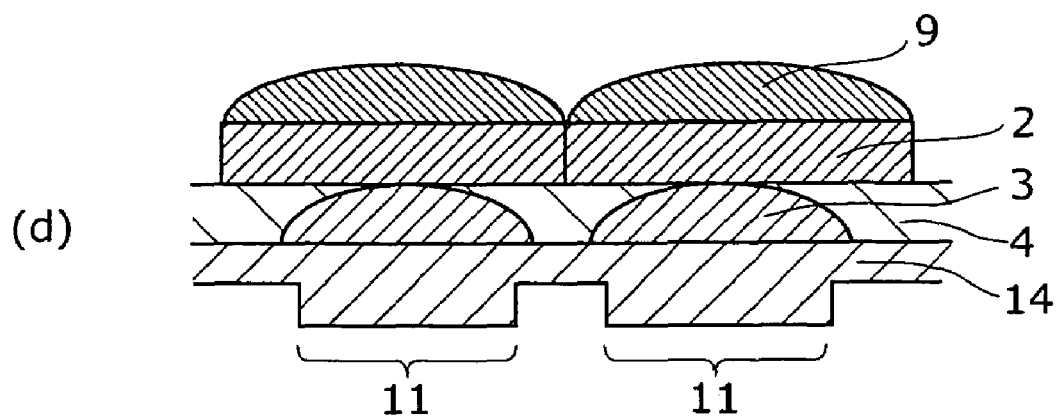
FIG. 13B is a diagram showing the manufacturing method continued from FIG. 13A.
Figure 13B:
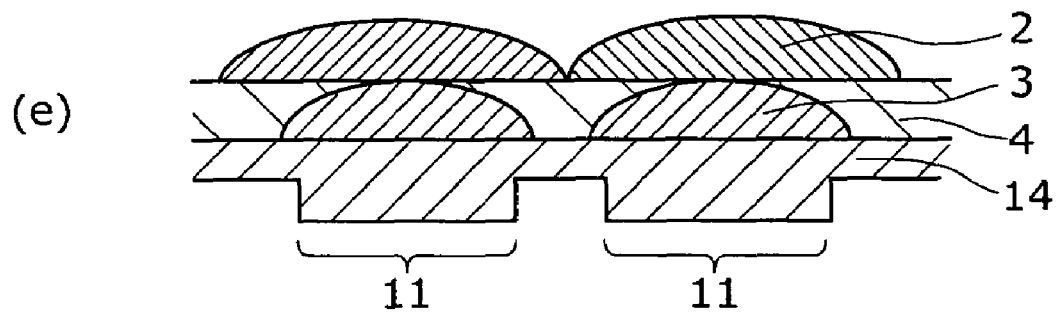
Figure 13B:
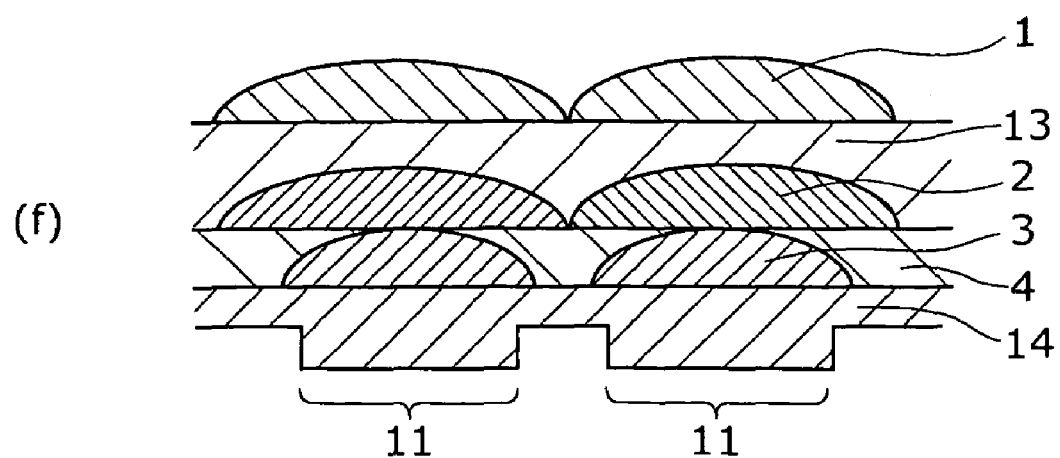

FIGS. 13A and 13B are diagrams for describing a process of the manufacturing method 3 for the solid-state image sensor of the fourth example (lens shape) shown in FIG. 6. The following describes the process.

As shown in FIG. 13A (a), a color filter resist of the first color is applied, and exposure and development are performed.

FIG. 13A (b) shows the color filter on which the development is performed. As shown in FIG. 13A (c), the color filters of other colors are formed in the same manner as in the process shown in FIGS. 13A (a) and 13A (b).

As shown in FIG. 13B (d), a lens shape or a semielliptic shape is formed for the cross-sectional shape of the color filter through the application of the resist that can be subjected to thermal flow processing, exposure, development and thermal flow processing.

As shown in FIG. 13B (e), the shape of the resist is transferred to the color filter 2 by etching back.

As shown in FIG. 13B (f), the transparent film 13 and the micro-lens 1 are formed on the color filter 2.

Thus, after the application of the color filter resist onto the in-layer lens flattening film 4, mask exposure and development are carried out, so as to form a pattern by which the cross-sectional shape is rectangular. After that, a resist that can be subjected to thermal flow processing is applied onto it, exposure, development, thermal flow and etching back are performed, and the lens shape of the resist resulted from the thermal flow is transferred to the color filter 2.

Figure 14A:
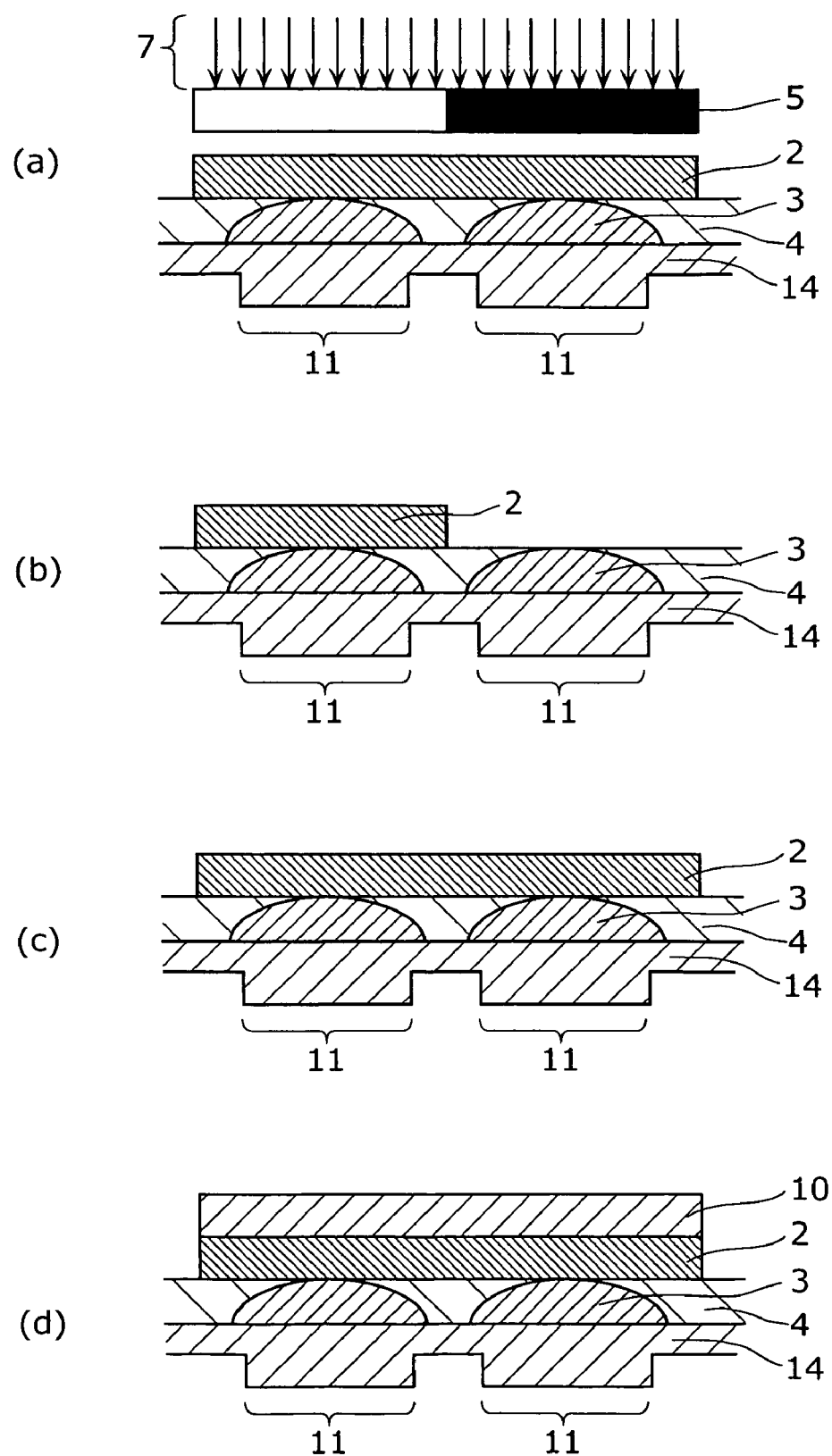
FIG. 14A is a diagram showing a manufacturing method 4 of a solid-state image sensor in which a cross-sectional structure of a color filter has a lens shape.
Figure 14B:
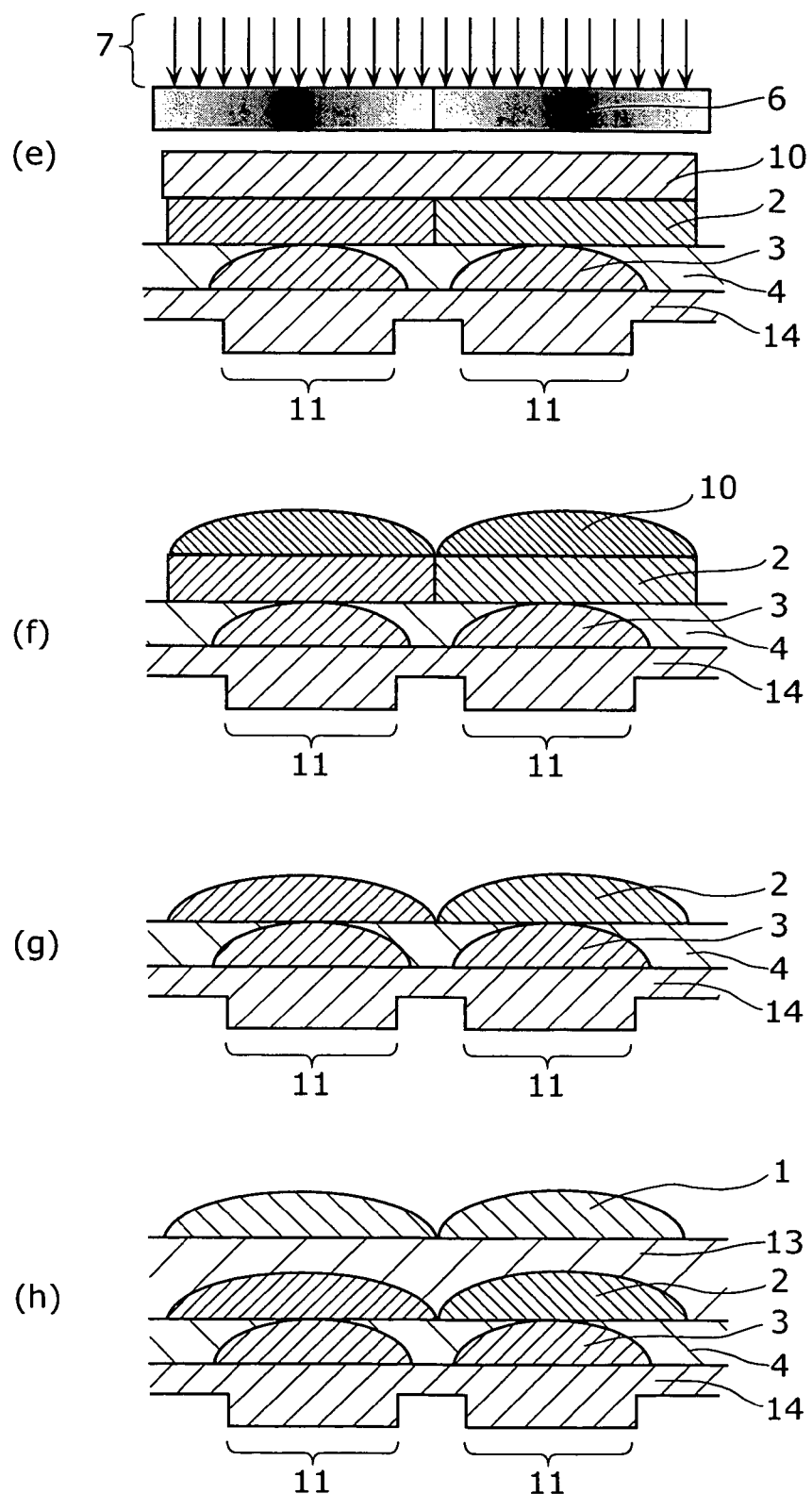
FIG. 14B is a diagram showing the manufacturing method continued from FIG. 14A.

FIGS. 14A and 14B are diagrams for describing a process of the manufacturing method 4 for the solid-state image sensor of the fourth example (lens shape) shown in FIG. 6. The following describes the process.

As shown in FIG. 14A (a), the color filter resist of the first color is applied, and exposure and development are performed.

FIG. 14A (b) shows the color filter to which the development is performed.

As shown in FIG. 14A (c), the color filters of other colors are formed in the same manner as in the process shown in FIGS. 14A (a) and 14A (b).

As shown in FIG. 14A (d), a resist 10 (of positive type) whose shape is transferred to the color filter is applied.

As shown in FIG. 14B (e), exposure and development are performed onto the resist 10 using a grey-tone mask, so that the resist 10 is formed to have a lens shape to be transferred.

FIG. 14B (f) shows the resist 10 that is formed to have a lens shape to be transferred.

As shown in FIG. 14B (g), the shape of the resist 10 is transferred to the color filter 2 by etching back.

As shown in FIG. 14B (h), the transparent film 13 and the micro-lens 1 are formed on the color filter 2.

Figure 15A:
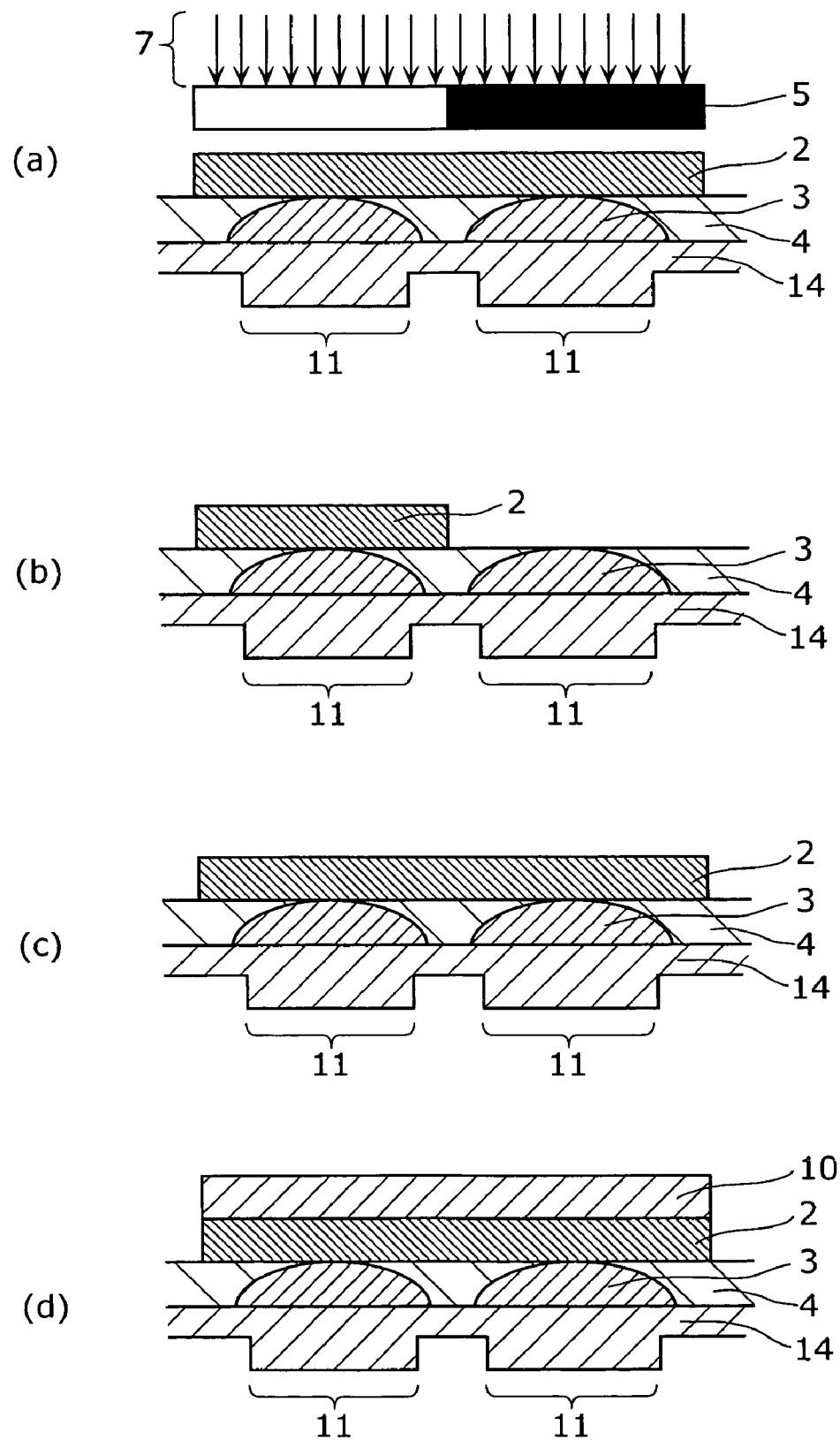
FIG. 15A is a diagram showing a manufacturing method 5 of a solid-state image sensor in which a cross-sectional structure of a color filter has a lens shape.
Figure 15B:
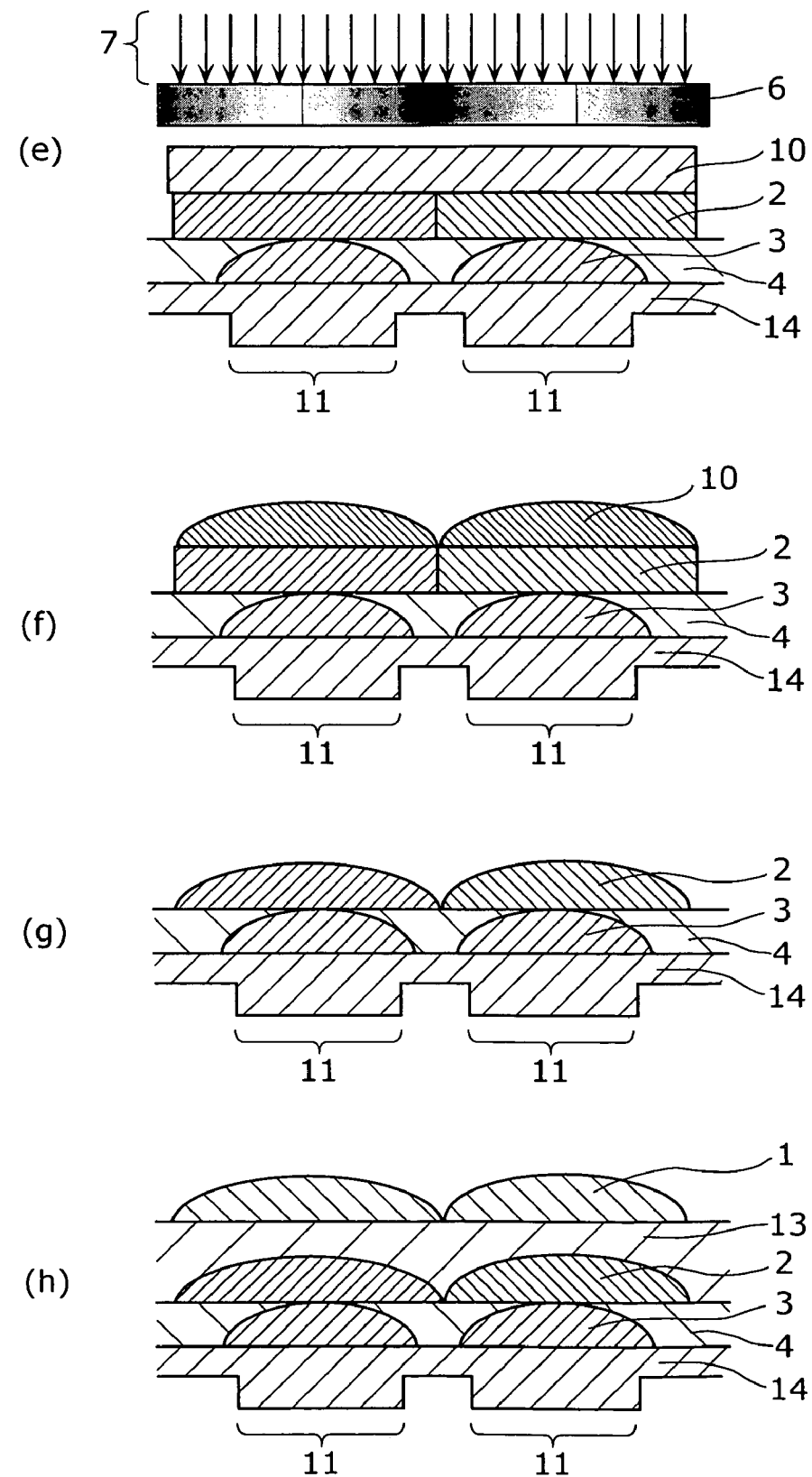
FIG. 15B is a diagram showing the manufacturing method 5 continued from FIG. 15A.

FIGS. 15A and 15B are diagrams for describing a process of the manufacturing method 5 for the solid-state image sensor of the fourth example (lens shape) shown in FIG. 6. The difference between the process shown in FIGS. 15A and 15B and the process shown in FIGS. 14A and 14B is that a negative-type resist is used instead of a positive-type resist. Therefore, the grey-tone mask shown in FIG. 15B (e) has the characteristics opposite to the grey-tone mask shown in FIG. 14B (e). Apart from this point, the process is same so that the description is not repeated here.

As shown in FIGS. 14A, 14B, 15A and 15B, after the application of the color filter resist onto the in-layer lens flattening film 4, mask exposure and development are performed, so that a pattern by which the cross-sectional shape is rectangular is formed. Then, a resist on which patterning can be performed is applied onto it, exposure is carried out using a grey-tone mask, and development is performed, so that the cross-sectional shape is formed like a micro-lens. The lens shape thus formed may be transferred to the color filter 2 by etching back, after the formation of the lens shape.

Figure 1:
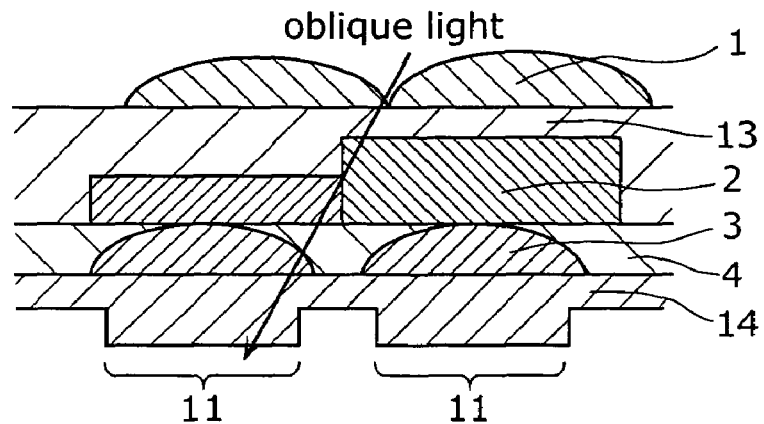
FIG. 1 is a diagram showing a conventional cross-sectional structure of a solid-state image sensor having an in-layer lens.
Figure 2A:
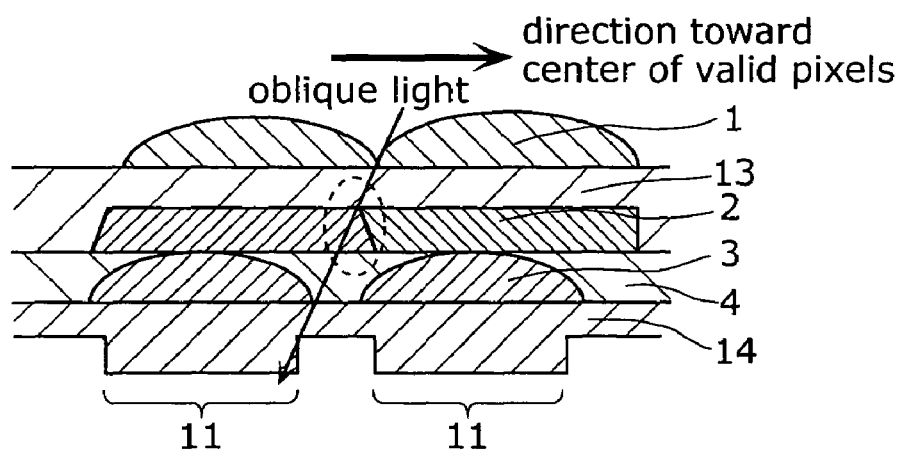
FIGS. 2A and 2B are diagrams respectively showing a conventional cross-sectional structure in the case where only thin-filming of a color filter is performed.
Figure 2B:
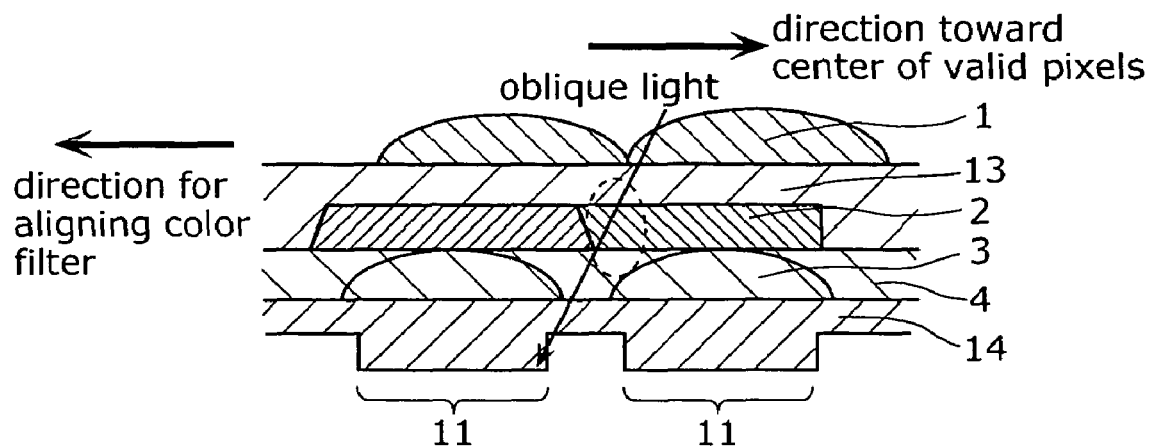

Note that the cross-sectional view shown in the respective FIGS. 3 through 6 shows the pixels located close to the center of the imaging area, and, the micro-lens 1 and the color filter 2 are positioned offset toward the center, as shown in FIGS. 1, 2A and 2B, in order to adjust an amount of oblique light received by the photodiode 11. The misalignment gets larger as a pixel cell is located away from the center of the imaging area toward the periphery. The misalignment of the micro-lens 1 is larger than the misalignment of the color filter 2.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

The present invention is suitable for a solid-state image sensor and a camera that has diodes, such as an image sensor, a digital steel camera, a cell phone equipped with a camera, a camera equipped to a laptop and a camera unit connected to an information processing device.

What is claimed is:

1. A solid-state image sensor comprising
a plurality of unit pixel cells arranged in a matrix form,
wherein each respective unit pixel cell of said plurality of unit pixel cells includes:
a respective photoelectric conversion element formed on a semiconductor substrate;
a respective color filter formed on said respective photoelectric conversion element;
a respective transparent film formed on said respective color filter; and
a respective micro-lens formed on said respective transparent film,
wherein a thickness at a center of each respective color filter of said plurality of color filters is greater than a thickness at a periphery of each respective color filter,
wherein only said respective transparent film is located between each respective color filter of said plurality of unit pixel cells,
wherein each respective color filter of said plurality of color filters adjoins another color filter of said plurality of color filters, such that an edge of a bottom surface of each respective color filter in a vertical and a horizontal direction adjoins an edge of a bottom surface of another color filter in the matrix form arrangement of said unit pixel cells, and
wherein a cross-section of each respective color filter of the plurality of unit pixel cells has an upward convex lens shape.

2. The solid-state image sensor according to claim 1, wherein a bottom surface of each respective color filter is flat.

3. A method of manufacturing a solid-state image sensor including a plurality of unit pixel cells arranged in a matrix form, each respective unit pixel cell of the plurality of unit pixel cells including a respective photoelectric conversion element and a respective color filter, said method of manufacturing the solid-state image sensor comprising:
a first step of forming the respective color filter on the respective photoelectric conversion element;
a second step of forming a respective transparent film on the respective color filter; and
a third step of forming a respective micro-lens on the respective transparent film,
wherein a thickness at a center of the respective color filter is greater than a thickness at a periphery of the respective color filter,
wherein only the respective transparent film is located between each respective color filter of the plurality of unit pixel cells,
wherein each respective color filter of said plurality of color filters adjoins another color filter of said plurality of color filters, such that an edge of a bottom surface of each respective color filter in a vertical and a horizontal direction adjoins an edge of a bottom surface of another color filter in the matrix form arrangement of said unit pixel cells, and
wherein a cross-section of each respective color filter of the plurality of unit pixel cells has an upward convex lens shape.

4. The method of manufacturing a solid-state image sensor, according to claim 3,
wherein said first step includes:
applying a respective color filter resist;
exposing the respective applied color filter resist using a grey-tone mask; and
forming the respective color filter by developing the respective exposed color filter resist, and
wherein the grey-tone mask includes a tone pattern having a density that varies depending on a thicknesses in a cross-section of each respective color filter.

5. The method of manufacturing a solid-state image sensor, according to claim 4, wherein the grey-tone mask includes a tone pattern by which each respective color filter is formed adjoining another respective color filter in a vertical and a horizontal direction in the arrangement of each unit pixel cell of the plurality of unit pixel cells.

6. The method of manufacturing a solid-state image sensor, according to claim 4, wherein the grey-tone mask includes a tone pattern having a density that varies depending on a thicknesses of a cross-section of each respective color filter.

7. The method of manufacturing a solid-state image sensor, according to claim 3,
wherein a cross-section of each respective color filter has a step-like shape that descends from the center of each respective color filter to the periphery of each respective color filter, wherein said first step includes:
  applying a respective color filter resist;
  exposing the respective applied color filter resist using a respective first mask;
  developing the respective exposed color filter resist to form a respective lower step of each respective color filter;
  further applying another respective color filter resist;
  exposing the another respective further applied color resist using a respective second mask; and
  developing the respective exposed and further applied color filter resist to form a respective upper step of each respective color filter, and
wherein the respective second mask includes a pattern adapted for each respective upper step having a respective top surface area that is smaller than a respective top surface area of each respective lower step.

8. The method of manufacturing a solid-state image sensor according to claim 3, wherein a bottom surface of each respective color filter is flat.

9. A camera equipped with a solid-state image sensor comprising a plurality of unit pixel cells arranged in a matrix form,
  wherein each respective unit pixel cell of the plurality of unit pixel cells includes:
    a respective photoelectric conversion element formed on a semiconductor substrate;
    a respective color filter formed on said respective photoelectric conversion element;
    a respective transparent film formed on said respective color filter; and
    a respective micro-lens formed on said respective transparent film,
  wherein a thickness at a center of each respective color filter of said plurality of color filters is greater than a thickness at a periphery of each respective color filter,
  wherein only said respective transparent film is located between each respective color filter of said plurality of unit pixel cells,
  wherein each respective color filter of said plurality of color filters adjoins another color filter of said plurality of color filters, such that an edge of a bottom surface of each respective color filter in a vertical and a horizontal direction adjoins an edge of a bottom surface of another color filter in the matrix form arrangement of said unit pixel cells, and
  wherein a cross-section of each respective color filter of the plurality of unit pixel cells has an upward convex lens shape.

10. The camera according to claim 9, wherein a bottom surface of each respective color filter is flat.

* * * * *

UNITED STATES PATENT AND TRADEMARK OFFICE
CERTIFICATE OF CORRECTION

PATENT NO. : 7,659,929 B2  Page 1 of 1
APPLICATION NO. : 11/206761
DATED : February 9, 2010
INVENTOR(S) : Hiroshi Sakoh It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 804 days.

Signed and Sealed this

Twenty-eighth Day of December, 2010

David J. Kappos
*Director of the United States Patent and Trademark Office*